United States Patent
Kim et al.

(10) Patent No.: US 11,287,474 B2
(45) Date of Patent: Mar. 29, 2022

(54) SCAN FLIP-FLOP AND SCAN TEST CIRCUIT INCLUDING THE SAME

(71) Applicant: SAMSUNG ELECTRONICS CO., LTD., Suwon-si (KR)

(72) Inventors: Ha-Young Kim, Seoul (KR); Sung-We Cho, Hwaseong-si (KR); Dal-Hee Lee, Seoul (KR); Jae-Ha Lee, Anyang-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 0 days.

(21) Appl. No.: 16/552,109

(22) Filed: Aug. 27, 2019

(65) Prior Publication Data
US 2019/0383875 A1 Dec. 19, 2019

Related U.S. Application Data

(63) Continuation of application No. 15/663,852, filed on Jul. 31, 2017, now Pat. No. 10,429,443, which is a continuation of application No. 14/873,634, filed on Oct. 2, 2015, now Pat. No. 9,753,086.

(60) Provisional application No. 62/058,880, filed on Oct. 2, 2014.

(30) Foreign Application Priority Data

Apr. 8, 2015 (KR) .......................... 10-2015-0049953
Aug. 21, 2015 (KR) .......................... 10-2015-0118271

(51) Int. Cl.
*G01R 31/3185* (2006.01)
*H03K 3/3562* (2006.01)

(52) U.S. Cl.
CPC . *G01R 31/318541* (2013.01); *H03K 3/35625* (2013.01)

(58) Field of Classification Search
None
See application file for complete search history.

(56) References Cited

U.S. PATENT DOCUMENTS

| | | |
|---|---|---|
| 5,173,626 A | 12/1992 | Kudou et al. |
| 5,281,865 A | 1/1994 | Yamashita et al. |
| 5,391,935 A | 2/1995 | Gersbach et al. |
| 5,684,744 A | 11/1997 | Orgill et al. |
| 5,784,384 A | 7/1998 | Maeno |
| 5,818,273 A | 10/1998 | Orgill et al. |
| 6,188,260 B1 | 2/2001 | Stotz et al. |

(Continued)

FOREIGN PATENT DOCUMENTS

| | | |
|---|---|---|
| JP | 1994-029791 A | 2/1994 |
| JP | 1997-186560 A | 7/1997 |

(Continued)

*Primary Examiner* — Cassandra F Cox
(74) *Attorney, Agent, or Firm* — Volentine, Whitt & Francos, PLLC

(57) ABSTRACT

A scan flip-flop includes an input unit and a flip-flop. The input unit is configured to select one signal from among a data input signal and a scan input signal to supply the selected one signal as an internal signal according to an operation mode. The flip-flop is configured to latch the internal signal according to a clock signal. The flip-flop includes a cross coupled structure that includes first and second tri-state inverters which share a first output node and face each other.

18 Claims, 17 Drawing Sheets

(56) References Cited

U.S. PATENT DOCUMENTS

| | | |
|---|---|---|
| 6,218,225 B1 | 4/2001 | Shaw |
| 6,266,749 B1 | 7/2001 | Hashimoto et al. |
| 6,412,098 B1 | 6/2002 | Jin |
| 7,237,164 B1 | 6/2007 | Katchmart |
| 7,320,098 B2 | 1/2008 | Shin |
| 7,479,806 B2 | 1/2009 | Teh et al. |
| 7,712,002 B2 | 5/2010 | Baba |
| 7,793,180 B1 | 9/2010 | Shrivastava |
| 8,441,279 B2 | 5/2013 | Lee |
| 8,451,041 B2 | 5/2013 | Su et al. |
| 8,502,561 B2 | 8/2013 | Howard et al. |
| 8,860,463 B1 | 10/2014 | Qureshi |
| 9,753,086 B2 | 9/2017 | Kim et al. |
| 2006/0085709 A1 | 4/2006 | Kim et al. |
| 2008/0284480 A1 | 11/2008 | Ahmadi |
| 2010/0308864 A1 | 12/2010 | Lee et al. |
| 2011/0304353 A1 | 12/2011 | Lee |
| 2012/0254817 A1 | 10/2012 | Sherlekar |
| 2013/0242645 A1 | 9/2013 | Calhoun et al. |
| 2014/0001564 A1 | 1/2014 | Song et al. |
| 2014/0027918 A1 | 1/2014 | Rashed et al. |
| 2014/0040688 A1* | 2/2014 | Zhang ............ G01R 31/318541 714/727 |
| 2014/0075087 A1 | 3/2014 | Bartling |
| 2014/0131816 A1 | 5/2014 | Wang et al. |
| 2014/0189453 A1 | 7/2014 | Gurumurthy |

FOREIGN PATENT DOCUMENTS

| | | |
|---|---|---|
| JP | 1997-270677 A | 10/1997 |
| JP | 2009-164933 A | 7/2009 |
| JP | 5355661 | 9/2013 |
| KR | 1019920001850 A | 1/1992 |
| KR | 1020050097226 A | 10/2005 |
| KR | 1020050112972 A | 12/2005 |
| KR | 10-0604904 B | 7/2006 |
| KR | 1020100132267 A | 12/2010 |
| KR | 102014-0012012 A | 1/2014 |
| KR | 1020140001578 A | 1/2014 |
| LR | 1020040001334 A | 1/2004 |

* cited by examiner

SCAN FLIP-FLOP AND SCAN TEST CIRCUIT INCLUDING THE SAME

CROSS-REFERENCE TO RELATED APPLICATIONS

This is a Continuation of U.S. application Ser. No. 15/663,852, filed Jul. 31, 2017, now U.S. Pat. No. 10,429,443 issued on Oct. 1, 2019, which is a Continuation of U.S. application Ser. No. 14/873,634, filed Oct. 2, 2015, now U.S. Pat. No. 9,753,086 issued on Sep. 5, 2017, and a claim of priority is made to U.S. Provisional Application No. 62/058,880, filed on Oct. 2, 2014, in the US Patent and Trademark Office, to Korean Patent Application No. 10-2015-0049953, filed on Apr. 8, 2015, in the Korean Intellectual Property Office, and to Korean Patent Application No. 10-2015-0118271, filed on Aug. 21, 2015, in the Korean Intellectual Property Office, the disclosures of which are incorporated herein in their entireties by reference.

BACKGROUND

The inventive concepts generally relate to electronic circuits, and more particularly, the inventive concepts relate to a scan flip-flops and to scan test circuits including scan flip-flops.

As semiconductor chips become increasing integrated, significant time and resources must be expended in testing the semiconductor chips. Design for testability (DFT) technology is being widely adopted to assure semiconductor chip quality standards and enhance test efficiency. Scan testing is an important aspect of DFT technology.

SUMMARY

According to an aspect of the inventive concepts, there is provided a scan flip-flop including an input unit and a flip-flop. The input unit is configured to select one signal from among a data input signal and a scan input signal to supply the selected one signal as an internal signal according to an operation mode. The flip-flop is configured to latch the internal signal according to a clock signal. The flip-flop includes a cross coupled structure that includes first and second tri-state inverters which share a first output node and face each other.

According to another aspect of the inventive concept, there is provided a scan test circuit including a sequential circuit unit and a combinational circuit. The sequential circuit unit is configured to include first and second scan flip-flops, at least one of the first and second scan flip-flops including a flip-flop that includes a cross coupled structure including first and second tri-state inverters which share a first output node and face each other. The combinational circuit unit is configured to include first and second combinational logic circuits. The first combinational logic circuit supplies a first data input signal, generated by performing a logic operation on pieces of data, to the first scan flip-flop, and the second combinational logic circuit supplies a second data input signal, generated by performing a logic operation on an output signal of the first scan flip-flop, to the second scan flip-flop.

According to yet another aspect of the inventive concepts, there is provided a data processing circuit including a logic circuit and a scan logic group. The scan logic group includes a plurality of scan flip-flops each receiving input data and scan data from the logic circuit, and each selecting and outputting the received input data or the received scan data to the logic circuit. At least one of the plurality of scan flip-flops including a flip-flop that includes a cross coupled structure including first and second tri-state inverters which share a first output node and face each other.

BRIEF DESCRIPTION OF THE DRAWINGS

Exemplary embodiments of the inventive concepts will be more clearly understood from the detailed description that follows taken in conjunction with the accompanying drawings, in which.

DETAILED DESCRIPTION OF THE EMBODIMENTS

Figure 1A:
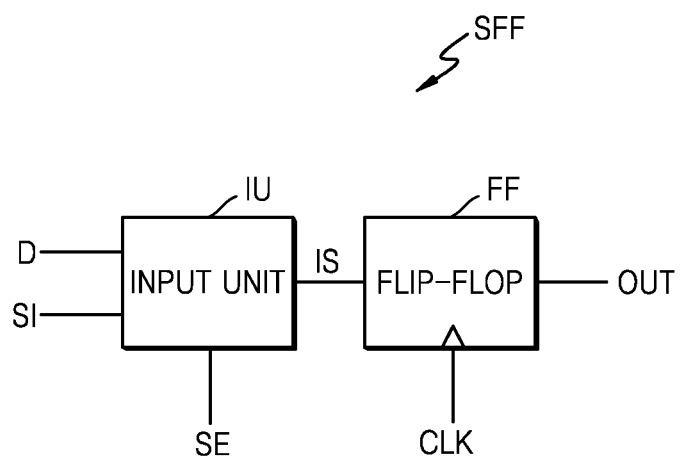
FIG. 1A is a block diagram schematically illustrating a scan flip-flop according to an exemplary embodiment.

As used herein, the term "and/or" includes any and all combinations of one or more of the associated listed items. Expressions such as "at least one of" when preceding a list of elements, modify the entire list of elements and do not modify the individual elements of the list.

Hereinafter, example embodiments of the inventive concepts will be described in detail with reference to the accompanying drawings. Embodiments of the inventive concepts are provided so that this disclosure will be thorough and complete, and will fully convey the inventive concepts to one of ordinary skill in the art. Since the inventive concepts may have diverse modified embodiments, preferred embodiments are illustrated in the drawings and are described in the detailed description of the inventive concept. However, this does not limit the inventive concepts within specific embodiments and it should be understood that the inventive concepts cover all the modifications, equivalents, and replacements within the idea and technical scope of the inventive concept. Like reference numerals refer to like elements throughout. In the drawings, the dimensions and size of each structure are exaggerated, reduced, or schematically illustrated for convenience in description and clarity.

The terms used in this application, only certain embodiments have been used to describe, is not intended to limit the present embodiments. In the following description, the technical terms are used only for explain a specific exemplary embodiment while not limiting the present embodiments. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Terms like a first and a second may be used to describe various elements, but the elements should not be limited by the terms. The terms may be used only as object for distinguishing an element from another element. For example, without departing from the spirit and scope of the inventive concept, a first element may be referred to as a second element, and similarly, the second element may be referred to as the first element.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An integrated circuit may be defined by a plurality of cells, and in detail, may be designed by using a cell library including characteristic information of the plurality of cells. Here, a name of a cell, a dimension, a gate width, a pin, delay characteristic, a leakage current, a threshold voltage, a function, and/or the like may be defined in the cell library. A cell library set may include basic cells such as an AND gate, an OR gate, a NOR gate, an inverter, etc., complex cells such as an OR/AND/INVERTER (OAI) gate, an AND/OR/INVERTER (AOI) gate, etc., and storage elements such as a master-slaver flip-flop, a latch, etc.

In exemplary embodiments to be described below, a cell may be a standard cell, and a cell library may be a standard cell library cell. A standard cell method may be a method where a plurality of standard cells having various functions are prepared, and a dedicated large scale integration (LSI) suitable for a specification of a customer or a user is designed by arbitrarily combining the plurality of standard cells. The standard cell may be previously designed and verified, and then may be registered in a computer. A logic design which is obtained by combining a plurality of standard cells with a computer aided design (CAD), placement, and routing may be made.

In detail, in a case of designing/manufacturing an LSI, when a plurality of standardized logic circuit blocks (or cells) are already preserved in a library, a logic circuit block suitable for the purpose of current design may be selected from among the plurality of standardized logic circuit blocks and may be disposed in a plurality of cell rows on a chip, and optimal routing where a routing length is shortest may be made in a routing space between cells, thereby manufacturing a whole circuit. As the kinds of cells preserved in the library are sufficient, an adaptability of a design is obtained, and thus, a possibility of an optimal design of a chip increases.

Figure 1B:
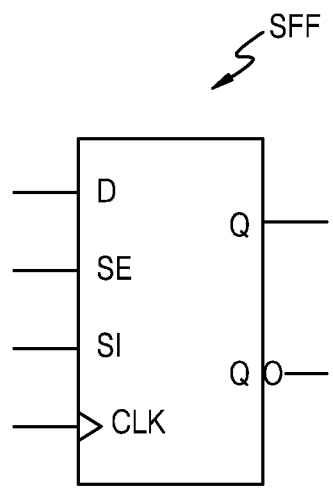
FIG. 1B is a logic symbol representing the scan flip-flop of FIG. 1A.

FIG. 1A is a block diagram schematically illustrating a scan flip-flop according to an exemplary embodiment, and FIG. 1B is a logic symbol representing the scan flip-flop of FIG. 1A.

Referring to FIGS. 1A and 1B, a scan flip-flip SFF may include an input unit IU and a flip-flop FF. The input unit IU may receive a data input signal D and a scan input signal SI. The input unit IU may select one signal from among the data input signal D and the scan input signal SI depending on an operation mode and may supply the selected signal as an internal signal IS. The flip-flip FF may latch the internal signal IS, based on a clock signal CLK.

In detail, in a first operation mode, the input unit IU may select the data input signal D and may supply the internal signal IS, based on the data input signal D. In a second operation mode, the input unit IU may select the scan input signal SI and may supply the internal signal IS, based on the scan input signal SI. For example, the first operation mode may a normal operation mode where data is transferred, and the second operation mode may a scan test mode where a test operation is performed.

In an exemplary embodiment, the operation mode may be determined based on a logic level of a scan enable signal SE. For example, when the scan enable signal SE has a first logic level (for example, a logic low level), the operation mode may be the normal operation mode. Alternately, when the scan enable signal SE has a second logic level (for example, a logic high level), the operation mode may be the scan test mode. However, the present embodiment is not limited in this respect.

In the normal operation mode, the input unit IU may supply the data input signal D as the internal signal IS, and the flip-flop FF may perform a normal operation of latching the data input signal D. In the scan test mode, the input unit IU may supply the scan input signal SI as the internal signal IS, and the flip-flop FF may perform a scan operation of latching the scan input signal SI.

Figure 2:
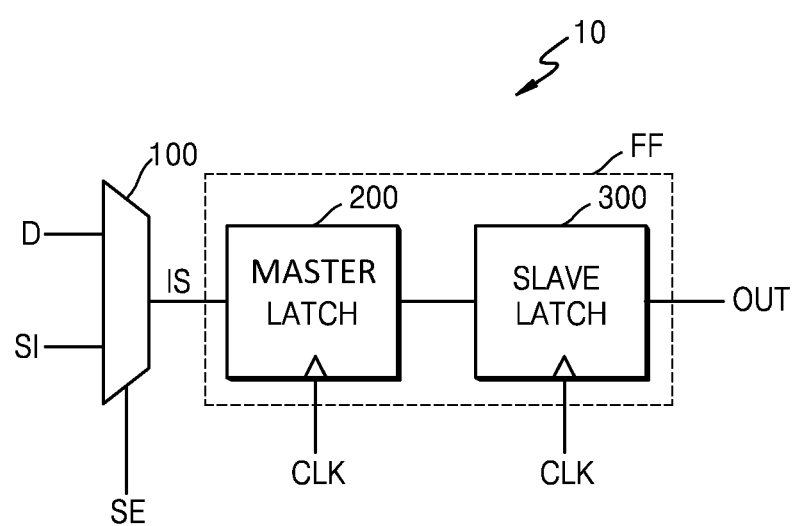
FIG. 2 is a block diagram illustrating in detail a scan flip-flop according to an exemplary embodiment.

FIG. 2 is a block diagram illustrating in detail a scan flip-flop 10 according to an exemplary embodiment.

Referring to FIG. 2, the scan flip-flop 10 may include a multiplexer 100, a master latch 200, and a slave latch 300. The scan flip-flop 10 of FIG. 2 may be considered an exemplary embodiment of the scan flip-flop SFF of FIG. 1. Therefore, details described above with reference to FIG. 1 may be applied to the present embodiment, and a repetitive description is not repeated.

The multiplexer 100 may correspond to the input unit IU of FIG. 1, but the present embodiment is not limited thereto. In other embodiments, the input unit IU of FIG. 1 may further include another element in addition to the multiplexer 100. The multiplexer 100 may select one signal from among a data input signal D and a scan input signal SI according to a scan enable signal SE, and may supply an internal signal IS based on the selected signal. The multiplexer 100 may be referred to as a mux, a scan mux, or a selector. In an exemplary embodiment, the multiplexer 100 may include a cross coupled structure. The cross coupled structure will be described later in detail with reference to FIG. 3.

The master latch 200 and the slave latch 300 may correspond to the flip-flop FF of FIG. 1, but the present embodiment is not limited thereto. In other embodiments, the flip-flop FF of FIG. 1 may further include another element other than the master latch 200 and the slave latch 300. The master latch 200 may latch the internal signal IS, based on a clock signal CLK. The slave latch 300 may latch an output of the master latch 200 to supply an output signal OUT, based on the clock signal CLK.

In an exemplary embodiment, the master latch 200 may include the cross coupled structure. In an exemplary embodiment, the slave latch 300 may include the cross coupled structure. In an exemplary embodiment, each of the master latch 200 and the slave latch 300 may include the cross coupled structure.

Figure 3:
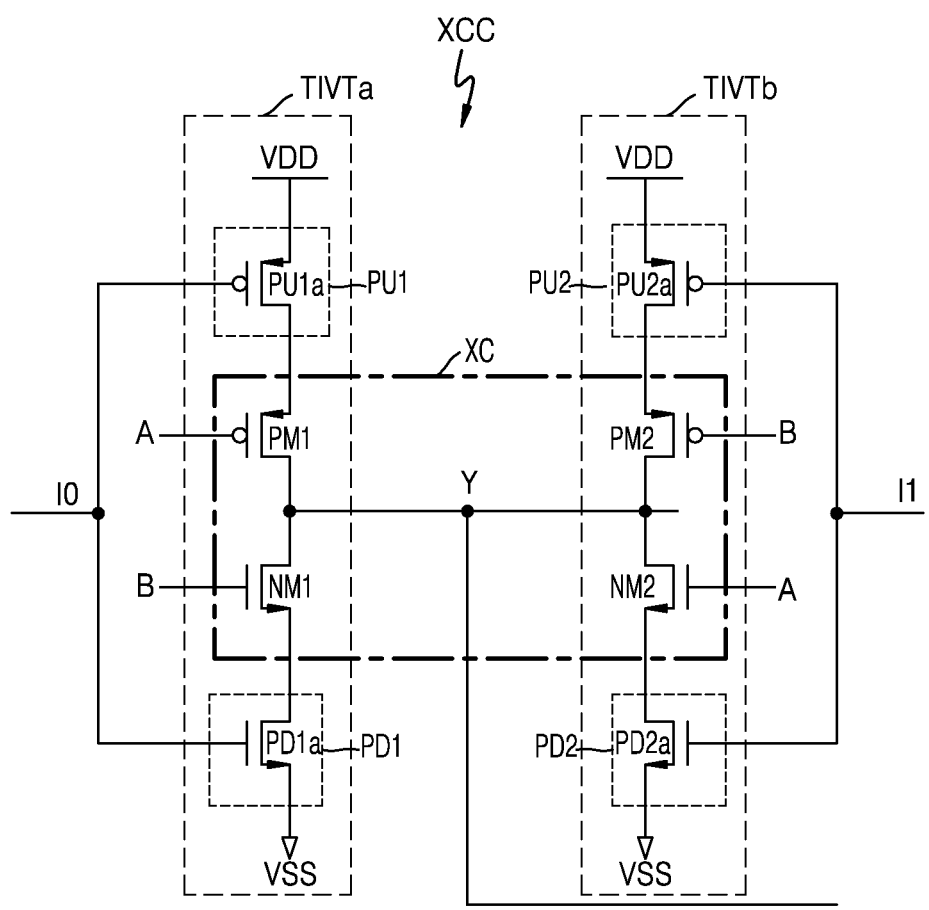
FIG. 3 is a circuit diagram illustrating a cross coupled circuit according to an exemplary embodiment.

FIG. 3 is a circuit diagram illustrating a cross coupled circuit XCC according to an exemplary embodiment.

Referring to FIG. 3, the cross coupled circuit XCC may be a circuit having the cross coupled structure and may include a first tri-state inverter TIVTa and a second tri-state inverter TIVTb. In the present embodiment, the first tri-state inverter TIVTa and the second tri-state inverter TIVTb may share an output node Y and may be disposed to face each other. The cross coupled circuit XCC may be included as some elements of the scan flip-flop 10 of FIG. 2. For example, the multiplexer 100, master latch 200, or slave latch 300 of FIG. 2 may include the cross coupled circuit XCC.

The first tri-state inverter TIVTa may include a first pull-up unit PU1, a first PMOS transistor PM1, a first NMOS transistor NM1, and a first pull-down unit PD1. In detail, the first pull-up unit PU1 may include a first pull-up transistor PU1a that includes a source connected to a power terminal VDD and a gate receiving a first input signal I0, and the first pull-down unit PD1 may include a first pull-down transistor PD1a that includes a source connected to a ground terminal GND and a gate connected to a first input terminal I0.

The first PMOS transistor PM1 may include a source connected to a drain of a first pull-up transistor PU1a, a gate receiving a first control signal A, and a drain connected to the output node Y. The first NMOS transistor NM1 may include a drain connected to the first PMOS transistor PM1 and the output node Y, a gate receiving a second control signal B, and a source connected to a first pull-down transistor PD1a.

The second tri-state inverter TIVTb may include a second pull-up unit PU2, a second PMOS transistor PM2, a second NMOS transistor NM2, and a second pull-down unit PD2. In detail, the second pull-up unit PU2 may include a second pull-up transistor PU2a that includes a source connected to the power terminal VDD and a gate receiving a second input signal I1, and the second pull-down unit PD2 may include a second pull-down transistor PD2a that includes a source connected to the ground terminal GND and a gate connected to a second input terminal I1.

The second PMOS transistor PM2 may include a source connected to a drain of a second pull-up transistor PU2a, a gate receiving the second control signal B, and a drain connected to the output node Y. The second NMOS transistor NM2 may include a drain connected to the second PMOS transistor PM2 and the output node Y, a gate receiving the first control signal A, and a source connected to a second pull-down transistor PD2a.

As described above, according to an exemplary embodiment, the first control signal A may be applied to the gate of the first PMOS transistor PM1 and the gate of the second NMOS transistor NM2, and the second control signal B may be applied to the gate of the first NMOS transistor NM1 and the gate of the second PMOS transistor PM2. In this way, the first and second PMOS transistors PM1 and PM2 and the first and second NMOS transistors NM1 and NM2 may constitute a cross coupled unit XC.

Figure 4:
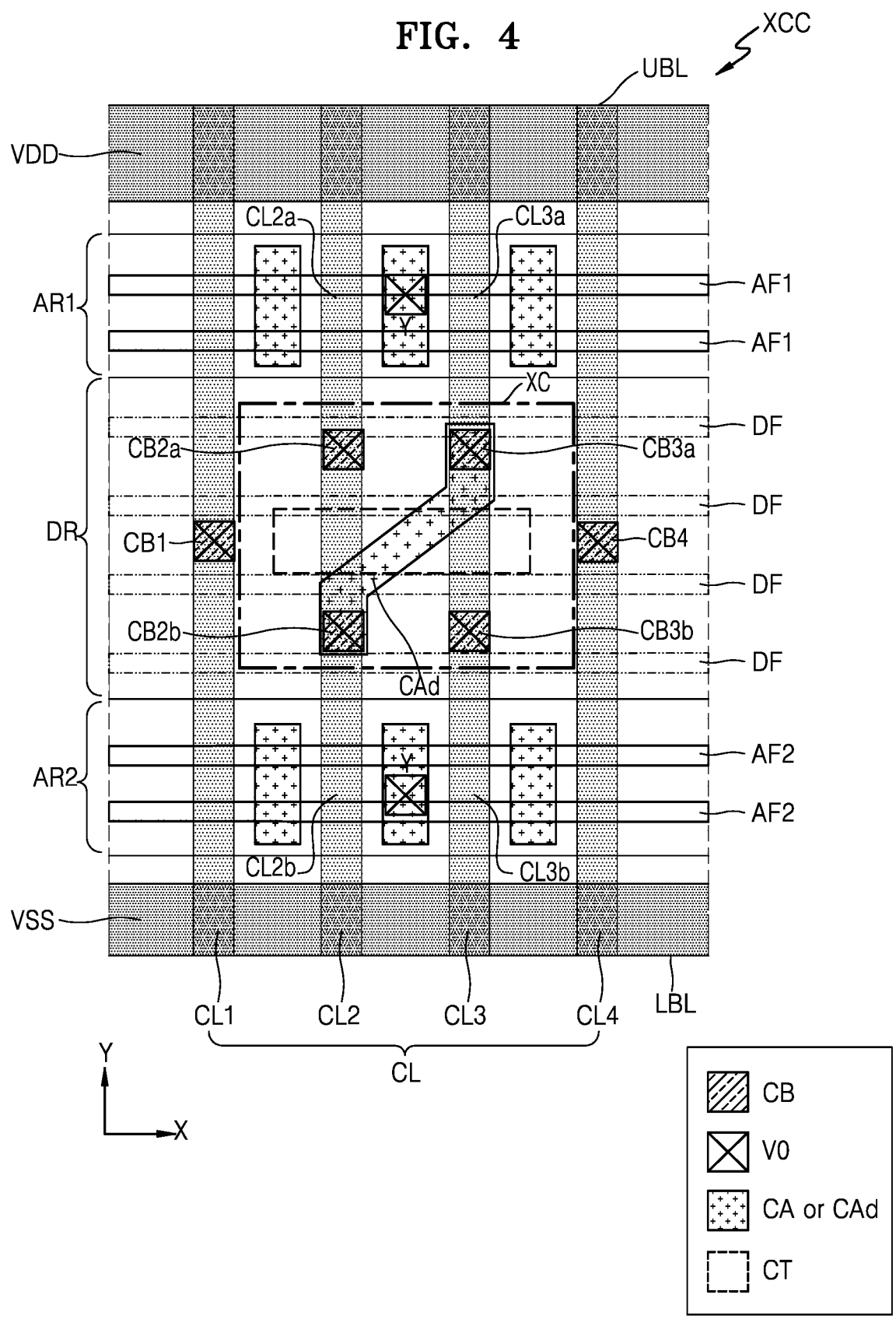
FIG. 4 is a layout example of the cross coupled circuit of FIG. 3.

FIG. 4 is a layout illustrating the cross coupled circuit XCC of FIG. 3.

Referring to FIG. 4, the cross coupled circuit XCC may be a portion of a standard cell and may include first and second active areas AR1 and AR2, a plurality of conductive lines CL, a plurality of source/drain contacts CA, and a plurality of gate contacts CB. The standard cell including the cross coupled circuit XCC may be limited by an upper boundary line UBL and a lower boundary line LBL, and may further include a plurality of circuits which are respectively disposed on a left side and a right side.

The first active area AR1 and the second active area AR2 may extend along a first direction (for example, an X direction) and may be disposed in parallel in a second direction (for example, a Y direction) which is substantially vertical to the first direction. In this case, the first active area AR1 may be disposed adjacent to the upper boundary line UBL, and the second active area AR2 may be disposed adjacent to the lower boundary line LBL.

The first active area AR1 and the second active area AR2 may have different conductive types. Each of the first active area AR1 and the second active area AR2 may be referred to as a diffusion area. In an exemplary embodiment, the first active area AR1 may correspond to an N type well, and the second active area AR2 may correspond to a P type well. In an exemplary embodiment, a substrate may be a P type substrate and may be used as the second active area AR2.

As shown in FIG. 4, a plurality of first active fins AF1 which extend along the first direction and are disposed in parallel in the second direction may be disposed in the first active area AR1. The plurality of first active fins AF1 may configure, for example, a PMOS transistor. Also, a plurality of second active fins AF2 which extend along the first direction and are disposed in parallel in the second direction may be disposed in the second active area AR2. The plurality of second active fins AF2 may configure, for example, an NMOS transistor.

A dummy area DR may be disposed between the first active area AR1 and the second active area AR2 as further shown in FIG. 4. In this case, at least one dummy fin DF which extends along the first direction and is parallel to the first and second active fins AF1 and AF2 may be disposed in the dummy area DR.

A plurality of conductive lines CL may extend along the second direction and may be disposed in parallel to each other in the first direction. In the present embodiment, the conductive lines CL may include first to fourth conductive lines CL1 to CL4 which are disposed in parallel. In this case, the conductive lines CL may each be formed of an arbitrary material having electric conductivity, and for example, may include polysilicon, metal, a metal alloy, and/or the like. In an exemplary embodiment, the conductive lines CL may correspond to gate electrodes. However, the present embodiment is not limited thereto. In other embodiments, each of the conductive lines CL may be a trace or the like having arbitrary conductivity.

In order to electrically insulate the second and third conductive lines CL2 and CL3 in the first active AR1 from the second and third conductive lines CL2 and CL3 in the second active AR2, a cutting layer CT may be disposed in the dummy area DR. Here, the cutting layer CT may be a marking layer for cutting a partial region of the second conductive line CL2 and a partial region of the third conductive line CL3.

In a semiconductor device which is manufactured based on a layout including the cutting layer CT, the second conductive line CL2 may be divided into a second upper conductive line CL2a in the first active area AR1 and a second lower conductive line CL2b in the second active area AR2. Therefore, the second upper conductive line CL2a may be electrically insulated from the second lower conductive line CL2b. Also, the third conductive line CL3 may be divided into a third upper conductive line CL3a in the first active area AR1 and a third lower conductive line CL3b in the second active area AR2. Therefore, the third upper conductive line CL3a may be electrically insulated from the third lower conductive line CL3b.

A plurality of source/drain contacts CA may be disposed in the first and second active areas AR1 and AR2 to extend along the second direction. Each of the plurality of source/drain contacts CA may be disposed between two adjacent conductive lines CL. In this case, the plurality of source/drain contacts CA may be referred to as source/drain contact patterns or source/drain contact plugs.

A via V0 corresponding to the output node Y may be formed on a source/drain contact CA disposed between the second upper conductive line CL2a and the third upper conductive line CL3a in the first active area AR1. The via V0 corresponding to the output node Y may be formed on a source/drain contact CA disposed between the second lower conductive line CL2b and the third lower conductive line CL3b in the second active area AR1. Although not shown, the output node Y in the first active area AR1 may be electrically connected to the output node Y in the second active area AR2 through a metal line disposed at an upper portion.

A plurality of gate contacts CB may be disposed in partial regions of the first to fourth conductive lines CL1 to CL4 corresponding to the dummy area DR. In this case, the plurality of gate contacts CB may be referred to as gate contact patterns or gate contact plugs. In detail, a first gate contact CB1 may be disposed on the first conductive line CL1, a second upper gate contact CB2a may be disposed on the second upper conductive line CL2a, a second lower gate contact CB2b may be disposed on the second lower conductive line CL2b, a third upper gate contact CB3a may be disposed on the third upper conductive line CL3a, a third lower gate contact CB3b may be disposed on the third lower conductive line CL3b, and a fourth gate contact CB4 may be disposed on the fourth conductive line CL4.

In an exemplary embodiment, the second and third upper gate contacts CB2a and CB3a may be disposed to be spaced apart from the lower boundary line LBL by substantially the same distance. In other words, the second and third upper gate contacts CB2a and CB3a may be disposed at a corresponding position along the first direction. In an exemplary embodiment, the second and third lower gate contacts CB2b and CB3b may be disposed to be spaced apart from the lower boundary line LBL by substantially the same distance. In other words, the second and third lower gate contacts CB2b and CB3b may be disposed at a corresponding position along the first direction.

The first input signal I0 may be applied through the first gate contact CB1 and may be transferred to the first conductive line CL1. The second input signal I1 may be applied through the fourth gate contact CB4 and may be transferred to the fourth conductive line CL4. The first control signal A may be applied through the second upper gate contact CB2a and the third lower gate contact CB3b and may be transferred to the second upper conductive line CL2a and the third lower conductive line CL3b. The second control signal B may be applied through the second lower gate contact CB2b and the third upper gate contact CB3a and may be transferred to the second lower conductive line CL2b and the third upper conductive line CL3a.

In this case, the via V0 that electrically connects each of the gate contacts to an upper metal line may be formed on each of the gate contacts. Here, the via V0 may be formed in a dimension which is substantially similar to that of each of the gate contacts. In some exemplary embodiments, the via V0 may not be formed on one of the second lower gate contact CB2b and the third upper gate contact CB3a.

According to the present embodiment, the cross coupled circuit XCC may further include a diagonal contact CAd that connects the second lower gate contact CB2b to the third upper gate contact CB3a. In this case, the diagonal contact CAd may extend in a diagonal direction, and thus may electrically connect the second lower gate contact CB2b and the third upper gate contact CB3a that are spaced apart from the lower boundary line LBL by different distances. In an exemplary embodiment, the diagonal contact CAd may be formed in the same process as a process of the plurality of source/drain contacts CA.

In an exemplary embodiment, a height from the substrate to an upper surface of the diagonal contact CAd may be formed to be substantially the same as the second lower gate contact CB2b to the third upper gate contact CB3a. In other words, the height from the substrate to the upper surface of the diagonal contact CAd may be substantially the same as a height from the substrate to an upper surface of the second lower gate contact CB2b and a height from the substrate to an upper surface of the third upper gate contact CB3a.

In an exemplary embodiment, the via V0 may be formed on the second lower gate contact CB2b, and the second control signal B may be applied through the via V0 and may be transferred to the third upper gate contact CB3a through the diagonal contact CAd. In an exemplary embodiment, the via V0 may be formed on the third upper gate contact CB3a, and the second control signal B may be applied through the via V0 and may be transferred to the second lower gate contact CB2b through the diagonal contact CAd.

A cross coupled unit of the related art does not include a cutting layer and a diagonal contact, and thus may be implemented in an area corresponding to three conductive lines. In other words, the cross coupled unit of the related art may be designed in an area corresponding to a 3 grid. Here, the 3 grid may correspond to an area based on the number of conductive lines and may be referred to as a contact poly pitch (CPP).

In an exemplary embodiment, the cross coupled unit XC may be implemented in an area corresponding to two conductive lines (i.e., the second and third conductive lines CL2 and CL3) by using the cutting layer CT, the second and third upper gate contacts CB2a and CB3a, the second and third lower gate contacts CB2b and CB3b, and the diagonal contact CAd. In other words, the cross coupled unit XC according to an exemplary embodiment may be designed in a 2 grid or a 2 CPP. Therefore, in comparison with the related art, the cross coupled unit XC according to an exemplary embodiment is reduced in area occupying the inside of a cell, thereby enhancing space efficiency.

Figure 5:
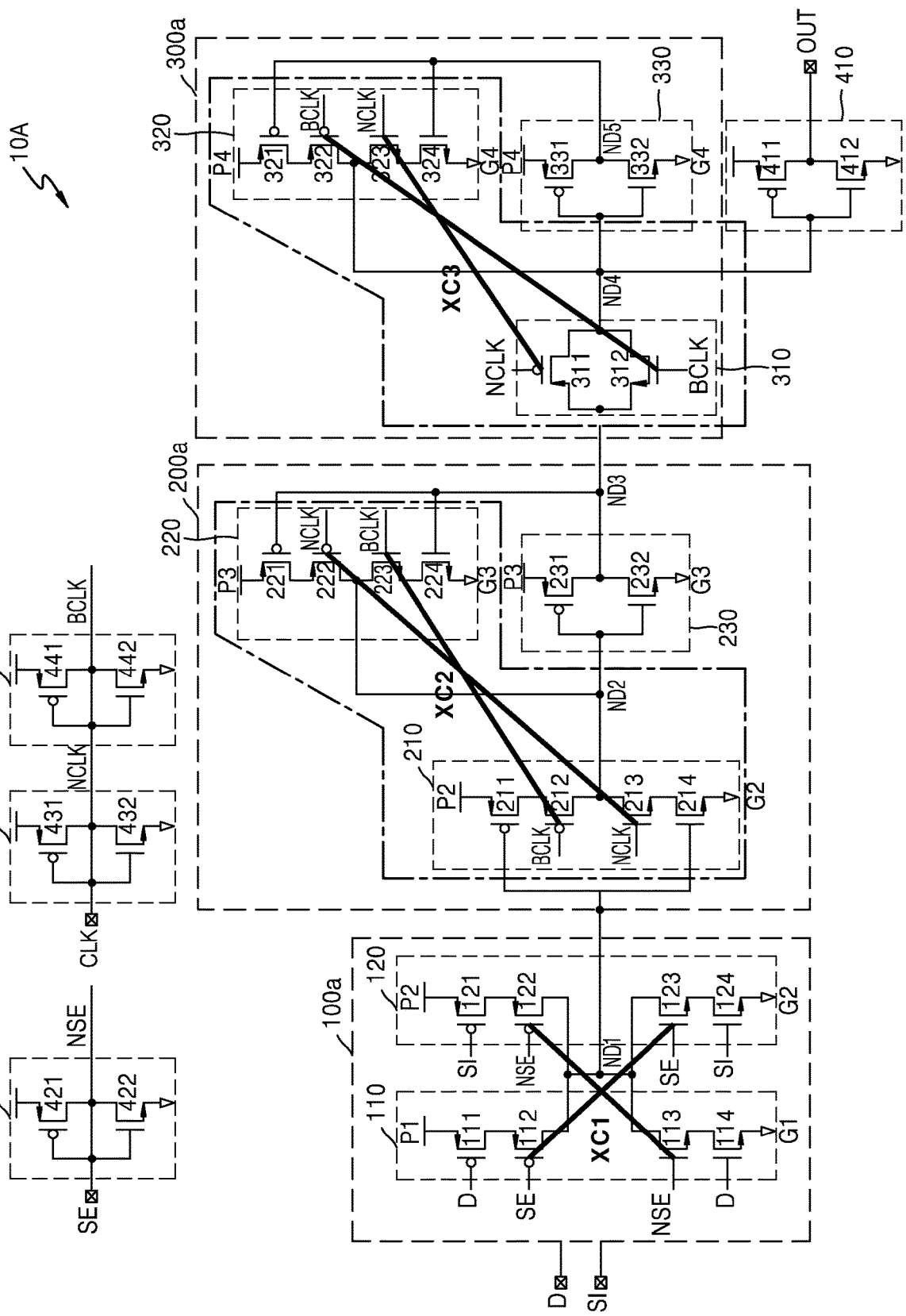
FIG. 5 is a circuit diagram illustrating a scan flip-flop according to an exemplary embodiment.

FIG. 5 is a circuit diagram illustrating a scan flip-flop 10A according to an exemplary embodiment.

Referring to FIG. 5, the scan flip-flop 10A may include a multiplexer 100a, a master latch 200a, and a slave latch 300a. The scan flip-flop 10A may further include a plurality of peripheral circuits 410 to 440. The scan flip-flop 10A according to the present embodiment may correspond to an implementation example of the scan flip-flop 10 of FIG. 2, and thus, details described above with reference to FIG. 2 may be applied to the present embodiment.

The multiplexer 100a may be implemented like the cross coupled circuit XCC illustrated in FIG. 3. In detail, the multiplexer 100a may include a first tri-state inverter 110 and a second tri-state inverter 120 which share a first output node ND1. A signal output from the first output node ND1 may correspond to the internal signal IS of FIG. 2. The first tri-state inverter 110 may invert a data input signal D, based on a scan enable signal SE and an inversion scan enable signal NSE, and the second tri-state inverter 120 may invert a scan input signal SI, based on the scan enable signal SE and the inversion scan enable signal NSE. An inverter 420 may invert the scan enable signal SE to output the inversion scan enable signal NSE.

The first tri-state inverter 110 may include a first pull-up transistor 111 connected to a first power terminal P1, a first PMOS transistor 112 connected between the first pull-up transistor 111 and the first output node ND1, a first NMOS transistor 113 connected to the first output node ND1, and a first pull-down transistor 114 connected between the first NMOS transistor 113 and a first ground terminal G1.

In detail, the first pull-up transistor 111 may include a source connected to the first power terminal P1 and a gate receiving the data input signal D. The first PMOS transistor 112 may include a source connected to a drain of the first pull-up transistor 111, a gate receiving the scan enable signal SE, and a drain connected to the first output node ND1. The first NMOS transistor 113 may include a drain connected to the first output node ND1 and a gate receiving the inversion scan enable signal NSE. The first pull-down transistor 114 may include a drain connected to a source of the first NMOS transistor 113, a gate receiving the data input signal D, and a source connected to the first ground terminal G1.

The second tri-state inverter 120 may include a second pull-up transistor 121 connected to a second power terminal P2, a second PMOS transistor 122 connected between the second pull-up transistor 121 and the first output node ND1, a second NMOS transistor 123 connected to the first output node ND1, and a second pull-down transistor 124 connected between the second NMOS transistor 123 and a second ground terminal G2.

In detail, the second pull-up transistor 121 may include a source connected to the second power terminal P2 and a gate receiving the scan input signal SI. The second PMOS transistor 122 may include a source connected to a drain of the second pull-up transistor 121, a gate receiving the inversion scan enable signal NSE, and a drain connected to the first output node ND1. The second NMOS transistor 123 may include a drain connected to the first output node ND1 and a gate receiving the scan enable signal SE. The second pull-down transistor 124 may include a drain connected to a source of the second NMOS transistor 123, a gate receiving the scan input signal SI, and a source connected to the second ground terminal G2.

In the present embodiment, the scan enable signal SE may be applied to the gate of the first PMOS transistor 112 and the gate of the second NMOS transistor 123, and the inversion scan enable signal NSE may be applied to the gate of the first NMOS transistor 113 and the gate of the second PMOS transistor 122. Therefore, the first and second PMOS transistors 112 and 122 and the first and second NMOS transistors 113 and 123 may configure a first cross coupled unit XC1. The first cross coupled unit XC1 may be implemented as the layout illustrated in FIG. 4, and thus, the first cross coupled unit XC1 may be designed in a 2 grid or a 2 CPP.

The master latch 200a may be implemented like the cross coupled circuit XCC illustrated in FIG. 3. In detail, the master latch 200a may include a third tri-state inverter 210 and a fourth tri-state inverter 220 that share a second output node ND2. Also, the master latch 200a may further include a first inverter 230. The third tri-state inverter 210 may invert an output (i.e., a signal of the first output node ND1) of the multiplexer 110a, based on a buffered clock signal BCLK and an inversion clock signal NCLK. The fourth tri-state inverter 220 may invert an output (i.e., a signal of a third output node ND3) of the first inverter 230, based on the buffered clock signal BCLK and the inversion clock signal NCLK. In this case, the inverter 430 may invert the clock signal CLK to output the inversion clock signal NCLK, and the inverter 440 may invert the inversion clock signal NCLK to output the buffered clock signal BCLK.

The third tri-state inverter 210 may include a third pull-up transistor 211 connected to the second power terminal P2, a third PMOS transistor 212 connected between the third pull-up transistor 211 and the second output node ND2, a third NMOS transistor 213 connected to the second output node ND2, and a third pull-down transistor 214 connected between the third NMOS transistor 213 and the second ground terminal G2.

In detail, the third pull-up transistor 211 may include a source connected to the second power terminal P2 and a gate connected to the first output node ND1. The third PMOS transistor 212 may include a source connected to a drain of the third pull-up transistor 211, a gate receiving the buffered clock signal BCLK, and a drain connected to the second output node ND2. The third NMOS transistor 213 may include a drain connected to the second output node ND2 and a gate receiving the inversion clock signal NCLK. The third pull-down transistor 214 may include a drain connected to a source of the third NMOS transistor 213, a gate connected to the first output node ND1, and a source connected to the second ground terminal G2.

The fourth tri-state inverter 220 may include a fourth pull-up transistor 221 connected to a third power terminal P3, a fourth PMOS transistor 222 connected between the fourth pull-up transistor 221 and the second output node ND2, a fourth NMOS transistor 223 connected to the second output node ND2, and a fourth pull-down transistor 224 connected between the fourth NMOS transistor 223 and a third ground terminal G3.

In detail, the fourth pull-up transistor 221 may include a source connected to the third power terminal P3 and a gate connected to the third output node ND3. The fourth PMOS transistor 222 may include a source connected to a drain of the fourth pull-up transistor 221, a gate receiving the buffered clock signal BCLK, and a drain connected to the second output node ND2. The fourth NMOS transistor 223 may include a drain connected to the second output node ND2 and a gate receiving the buffered clock signal BCLK. The fourth pull-down transistor 224 may include a drain connected to a source of the fourth NMOS transistor 223, a gate connected to the third output node ND3, and a source connected to the third ground terminal G3.

In the present embodiment, the buffered clock signal BCLK may be applied to the gate of the third PMOS transistor 212 and the gate of the fourth NMOS transistor 223, and the inversion clock signal NCLK may be applied to the gate of the third NMOS transistor 213 and the gate of the fourth PMOS transistor 222. Therefore, the third and fourth PMOS transistors 212 and 222 and the third and fourth NMOS transistors 213 and 223 may configure a second cross coupled unit XC2. The second cross coupled unit XC2 may be implemented as the layout illustrated in FIG. 4, and thus, the second cross coupled unit XC2 may be designed in a 2 grid or a 2 CPP.

A master latch included in a related art scan flip-flop includes a transmission gate that receives an output (i.e., an internal signal) of a multiplexer, and thus supplies the internal signal to an output node without inverting the internal signal. In this case, the transmission gate may be implemented with two transistors, and thus includes a less number of transistors than the number of transistors included in the tri-state inverter 210 according to the present embodiment. However, in the related art, mergence of a power terminal/ground terminal cannot be made between a multiplexer and a master latch, and for this reason, a cell area cannot be reduced, causing a reduction in space efficiency.

According to the present embodiment, the master latch 200a may include the third tri-state inverter 210 receiving an output of the multiplexer 100a, and thus may invert a signal of the first output node ND1 to supply an inverted signal to the second output node ND2. In this case, the third tri-state inverter 210 may be implemented with four transistors 211 to 214, and thus, in comparison with the related art, the third tri-state inverter 210 includes a more number of transistors. However, according to the present embodiment, mergence of a power terminal/ground terminal may be made between the second tri-state inverter 120 included in the multiplexer 100a and the third tri-state inverter 210 included in the master latch 200a, thereby further decreasing a cell area.

In detail, the second tri-state inverter 120 included in the multiplexer 100a and the third tri-state inverter 210 included in the master latch 200a may be disposed adjacent to each other in a first direction. Therefore, the second tri-state inverter 120 and the third tri-state inverter 210 may share the second power terminal P2 and the second ground terminal G2. In other words, a power terminal of the third tri-state inverter 210 may be merged with the second power terminal P2 of the second tri-state inverter 120, and a ground terminal of the third tri-state inverter 210 may be merged with the second ground terminal G2 of the second tri-state inverter 120. Therefore, for example, a size of an area necessary for implementing the multiplexer 110a and the master latch 200a may be further reduced by a 1 to 2 grid.

The slave latch 300a may include a transmission gate 310 and a fifth tri-state inverter 320. Also, the slave latch 300a may further include a second inverter 330. The transmission gate 310 may transfer an output (i.e., a signal of the third output node ND3) of the mater latch 200a, based on the buffered clock signal BCLK and the inversion clock signal NCLK. The second inverter 330 may invert a signal of a fourth output node ND4, and the fifth tri-state inverter 320 may invert a signal of a fifth output node ND5, based on the buffered clock signal BCLK and the inversion clock signal NCLK.

The fifth tri-state inverter 320 may include a fifth pull-up transistor 321 connected to a fourth power terminal P4, a fifth PMOS transistor 322 connected between the fifth pull-up transistor 321 and the fourth output node ND4, a fifth NMOS transistor 323 connected to the fourth output node ND4, and a fifth pull-down transistor 324 connected between the fifth NMOS transistor 323 and a fourth ground terminal G4.

In detail, the fifth pull-up transistor 321 may include a source connected to the fourth power terminal P4 and a gate connected to the fifth output node ND5. The fifth PMOS transistor 322 may include a source connected to a drain of the fifth pull-up transistor 321, a gate receiving the buffered clock signal BCLK, and a drain connected to the fourth output node ND4. The fifth NMOS transistor 323 may include a drain connected to the fourth output node ND4 and a gate receiving the inversion clock signal NCLK. The fifth pull-down transistor 324 may include a drain connected to a source of the fifth NMOS transistor 323, a gate connected to the fifth output node ND5, and a source connected to the fifth ground terminal G4.

The transmission gate 310 may include a sixth PMOS transistor 311 and a sixth NMOS transistor 312. The sixth PMOS transistor 311 may include a gate that is connected between the third output node ND3 and the fourth output node ND4 and receives the inversion clock signal NCLK. The sixth NMOS transistor 312 may include a gate that is connected between the third output node ND3 and the fourth output node ND4 and receives the buffered clock signal BCLK.

The second inverter 330 may include a sixth pull-up transistor 331 and a sixth pull-down transistor 332. The sixth pull-up transistor 331 may include a source connected to the fourth power terminal P4, a gate connected to the fourth output node ND4, and a drain connected to the fifth output node ND5. The sixth pull-down transistor 332 may include a drain connected to the fifth output node ND5, a gate connected to the fourth output node ND4, and a source connected to the fourth ground terminal G4.

In the present embodiment, the buffered clock signal BCLK may be applied to the gate of the fifth PMOS transistor 322 and the gate of the sixth NMOS transistor 312, and the inversion clock signal NCLK may be applied to the gate of the fifth NMOS transistor 323 and the gate of the sixth PMOS transistor 311. Therefore, the fifth and sixth PMOS transistors 322 and 311 and the fifth and sixth NMOS transistors 323 and 312 may configure a third cross coupled unit XC3. The third cross coupled unit XC3 may be implemented as the layout illustrated in FIG. 4, and thus, the third cross coupled unit XC3 may be designed in a 2 grid or a 2 CPP.

Therefore, according to the present embodiment, since the multiplexer 100a includes the first cross coupled unit XC1, the master latch 200a includes the second cross coupled unit XC2, and the slave latch 300a includes the third cross coupled unit XC3, a cell size of the scan flip-flop 10A is reduced by a 3 grid in comparison with the related art. Furthermore, according to the present embodiment, since the master latch 200a includes the third tri-state inverter 210 instead of a general inverter, the cell size of the scan flip-flop 10A is further reduced by a 1 to 2 grid in comparison with the related art.

Figure 6:
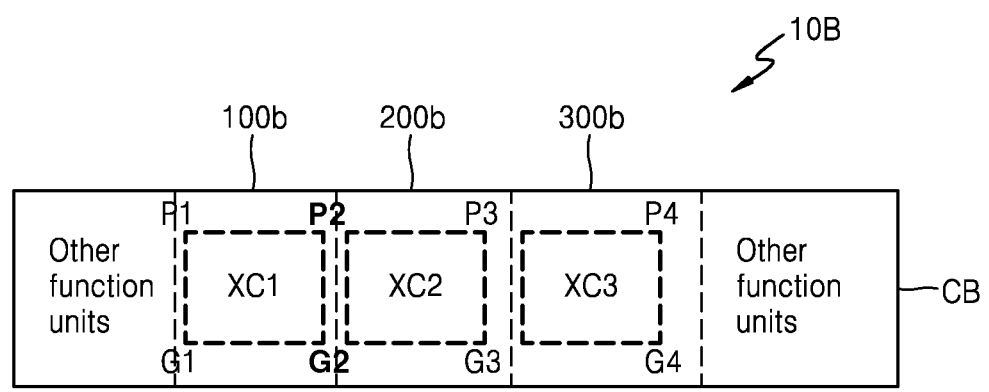
FIG. 6 schematically illustrates an example of a standard cell in which the scan flip-flop of FIG. 5 is implemented.

FIG. 6 schematically illustrates a standard cell 10B in which the scan flip-flop of FIG. 5 is implemented.

Referring to FIG. 6, the standard cell 10B may be limited by a cell boundary CB and may include a multiplexer 100b, a master latch 200b, and a slave latch 300b. For example, the standard cell 10B may include other function units such as the peripheral circuits 420, 430 and 440 of FIG. 5. The multiplexer 100b may include the multiplexer 100a of FIG. 5 and may further include other elements. The master latch 200b may include the master latch 200a of FIG. 5 and may further include other elements. The slave latch 300b may include the slave latch 300a of FIG. 5 and may further include other elements. Therefore, details described above with reference to FIG. 5 may be applied to the present embodiment.

The multiplexer 100b may include a first cross coupled unit XC1. A first tri-state inverter 110 may be connected between a first power terminal P1 and a first ground terminal G1, and a second tri-state inverter 120 may be connected between a second power terminal P2 and a second ground terminal G2. The first cross coupled unit XC1 may be implemented as in FIG. 4, and a 1 grid gain may be acquired for a size of the multiplexer 100b. The master latch 200b may include a second cross coupled unit XC2. A third tri-state inverter 210 may be connected between a second power terminal P2 and a second ground terminal G2, and a fourth tri-state inverter 220 may be connected between a third power terminal P3 and a third ground terminal G3. The second cross coupled unit XC2 may be implemented as in FIG. 4, and a 1 grid gain may be acquired for a size of the master latch 200b.

The slave latch 300b may include a third cross coupled unit XC3. A fifth tri-state inverter 320 may be connected between a fourth power terminal P4 and a fourth ground terminal G4. The third cross coupled unit XC3 may be implemented as in FIG. 4, and a 1 grid gain may be acquired for a size of the slave latch 300b. Also, the multiplexer 100b and the master latch 200b may share the second power terminal P2 and the second ground terminal G2, and thus, a 1 to 2 grid gain may be acquired for sizes of the multiplexer 100b and the master latch 200b. Accordingly, in comparison with the related art, a 4 to 5 grid gain may be acquired for a total size of the standard cell 10B in which the scan flip-flop is implemented.

Figure 7:
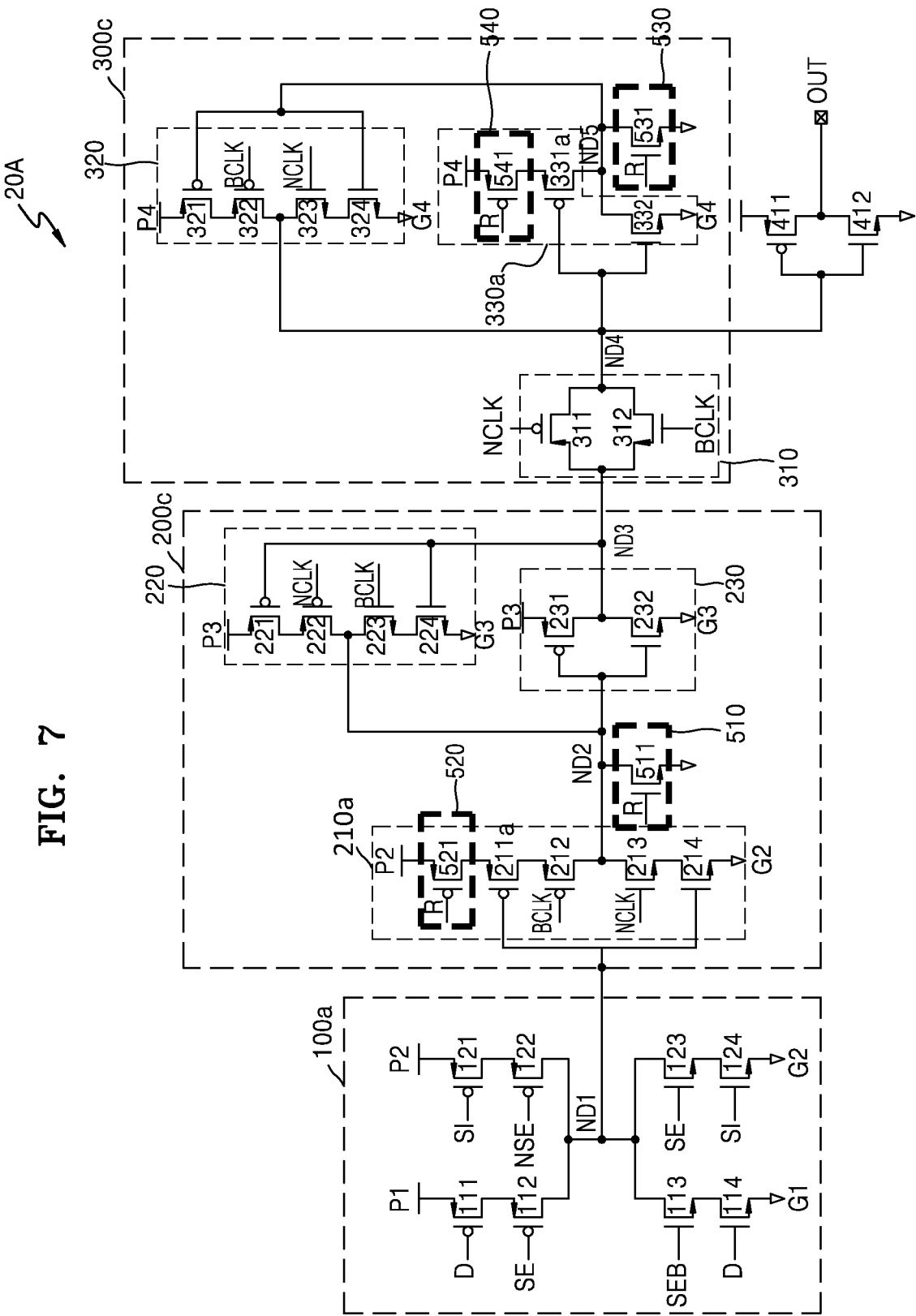
FIG. 7 is a circuit diagram illustrating a scan flip-flop according to another exemplary embodiment.

FIG. 7 is a circuit diagram illustrating a scan flip-flop 20A according to another exemplary embodiment.

Referring to FIG. 7, the scan flip-flop 20A according to another exemplary embodiment may be a scan flip-flop having a reset function and may include a multiplexer 100a, a master latch 200c, and a slave latch 300c. The scan flip-flop 20A may correspond to a modification embodiment of the scan flip-flop 10A illustrated in FIG. 5. Hereinafter, a difference between the scan flip-flop 10A of FIG. 5 and the scan flip-flop 20A according to the present embodiment will be described. In this case, like reference numerals refer to like elements, and a repetitive description is not repeated.

The master latch 200c may include a third tri-state inverter 210a, a fourth tri-state inverter 220, a first inverter 230, and a first reset switch 510. The first reset switch 510 may include an NMOS transistor 511 that includes a drain connected to a second output node ND2, a gate receiving a reset control signal R, and a source connected to a ground terminal. The reset control signal R may be a signal for controlling a reset operation. When the reset control signal R is activated, namely, when the reset control signal R has a logic high level, the first reset switch 510 may be turned on, and a voltage of the second output node ND2 may have a ground level, whereby an output of the master latch 200c may be reset.

The third tri-state inverter 210a may include a second reset switch 520, a third pull-up transistor 211a, a third PMOS transistor 212, a third NMOS transistor 213, and a third pull-down transistor 214. The second reset switch 520 may include a PMOS transistor 521 that includes a source connected to the second power terminal P2 and a gate receiving the reset control signal R. A source of the third pull-up transistor 211a may be connected to a drain of the PMOS transistor 521. When the reset control signal R is activated, the second reset switch 520 may be turned off, and thus, a source voltage cannot be supplied to the second output node ND2.

The slave latch 300c may include a transmission gate 310, a fifth tri-state inverter 320, a second inverter 330a, and a third reset switch 530. The third reset switch 530 may include an NMOS transistor 531 that includes a drain connected to the fifth output node ND5, a gate receiving the reset control signal R, and a source connected to a ground terminal. When the reset control signal R is activated, the third reset switch 530 may be turned on, and a voltage of the fifth output node ND5 may have a ground level.

The second inverter 330a may include a fourth reset switch 540, a sixth pull-up transistor 331a, and a sixth pull-down transistor 332. The fourth reset switch 540 may include a PMOS transistor 541 that includes a source connected to a fourth power terminal P4 and a gate receiving the reset control signal R. A source of the sixth pull-up transistor 331a may be connected to a drain of the PMOS transistor 541. When the reset control signal R is activated, the fourth reset switch 540 may be turned off, and thus, the source voltage cannot be supplied to the fifth output node ND5.

According to the present embodiment, the multiplexer 100a, the master latch 200c, and the slave latch 300c included in the scan flip-flop 20A having the reset function may each include a cross coupled unit like the scan flip-flip 10A illustrated in FIG. 5. For example, the multiplexer 100a, the master latch 200c, and the slave latch 300c may respectively include first to third cross coupled units XC1 to XC3. The first to third cross coupled units XC1 to XC3 may be implemented as in FIG. 4, thereby acquiring a 3 grid gain. Furthermore, the multiplexer 100a and the master latch 200c may share the second power terminal P2 and the second ground terminal G2, and thus, a 1 to 2 grid gain may be acquired for sizes of the multiplexer 100a and the master latch 200c.

According to the present embodiment, the scan flip-flop 20A may perform the reset operation, based on the reset control signal R indicating the reset operation. For example, the scan flip-flip 20A may perform a normal operation or a scan test operation in response to the reset control signal R having a logic low level and may perform the reset operation in response to the reset control signal R having a logic high level.

Figure 8:
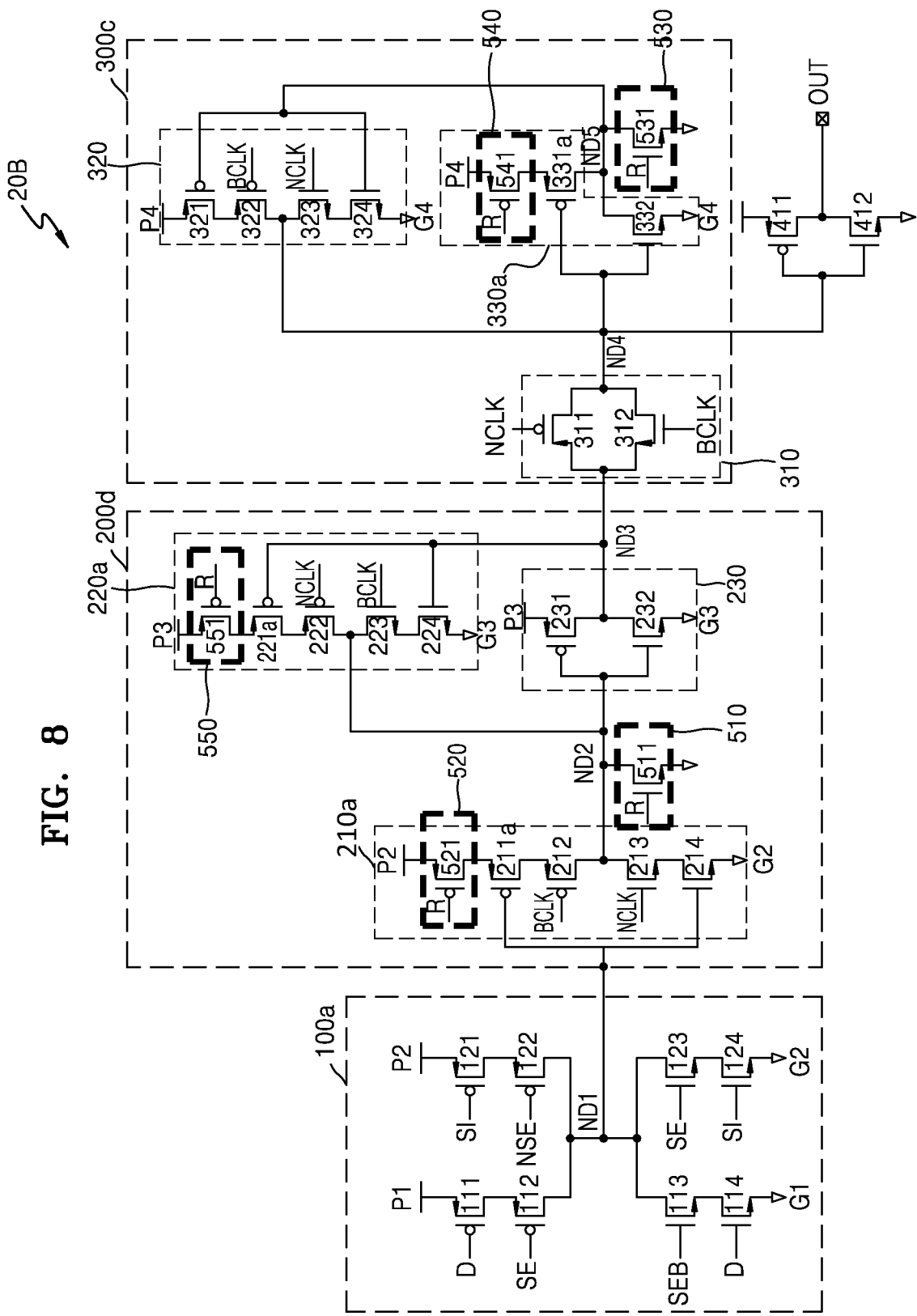
FIG. 8 is a circuit diagram illustrating a modification example of the scan flip-flop of FIG. 7.

FIG. 8 is a circuit diagram illustrating a modification example 20B of the scan flip-flop of FIG. 7.

Referring to FIG. 8, a scan flip-flop 20B according to the present embodiment may be a scan flip-flop having a reset function and may include a multiplexer 100a, a master latch 200d, and a slave latch 300c. The scan flip-flop 20B may correspond to a modification embodiment of the scan flip-flop 20A illustrated in FIG. 7. Hereinafter, a difference between the scan flip-flop 20A of FIG. 7 and the scan flip-flop 20B according to the present embodiment will be described. In this case, like reference numerals refer to like elements, and a repetitive description is not repeated.

A fourth tri-state inverter 220a included in the master latch 200d may include a fifth reset switch 550, a fourth pull-up transistor 221a, a fourth PMOS transistor 222, a fourth NMOS transistor 223, and a fourth pull-down transistor 224. The fifth reset switch 550 may include a PMOS transistor 551 that includes a source connected to a third power terminal P3 and a gate receiving a reset control signal R. A source of the fourth pull-up transistor 221a may be connected to a drain of the PMOS transistor 551.

According to the present embodiment, when the reset control signal R is activated, the fifth reset switch 550 may be turned off, and thus, a source voltage cannot be supplied to a second output node ND2. Therefore, even when a driving force of the fourth pull-up transistor 221 is strong, the second output node ND2 stably outputs a ground voltage.

Figure 9:
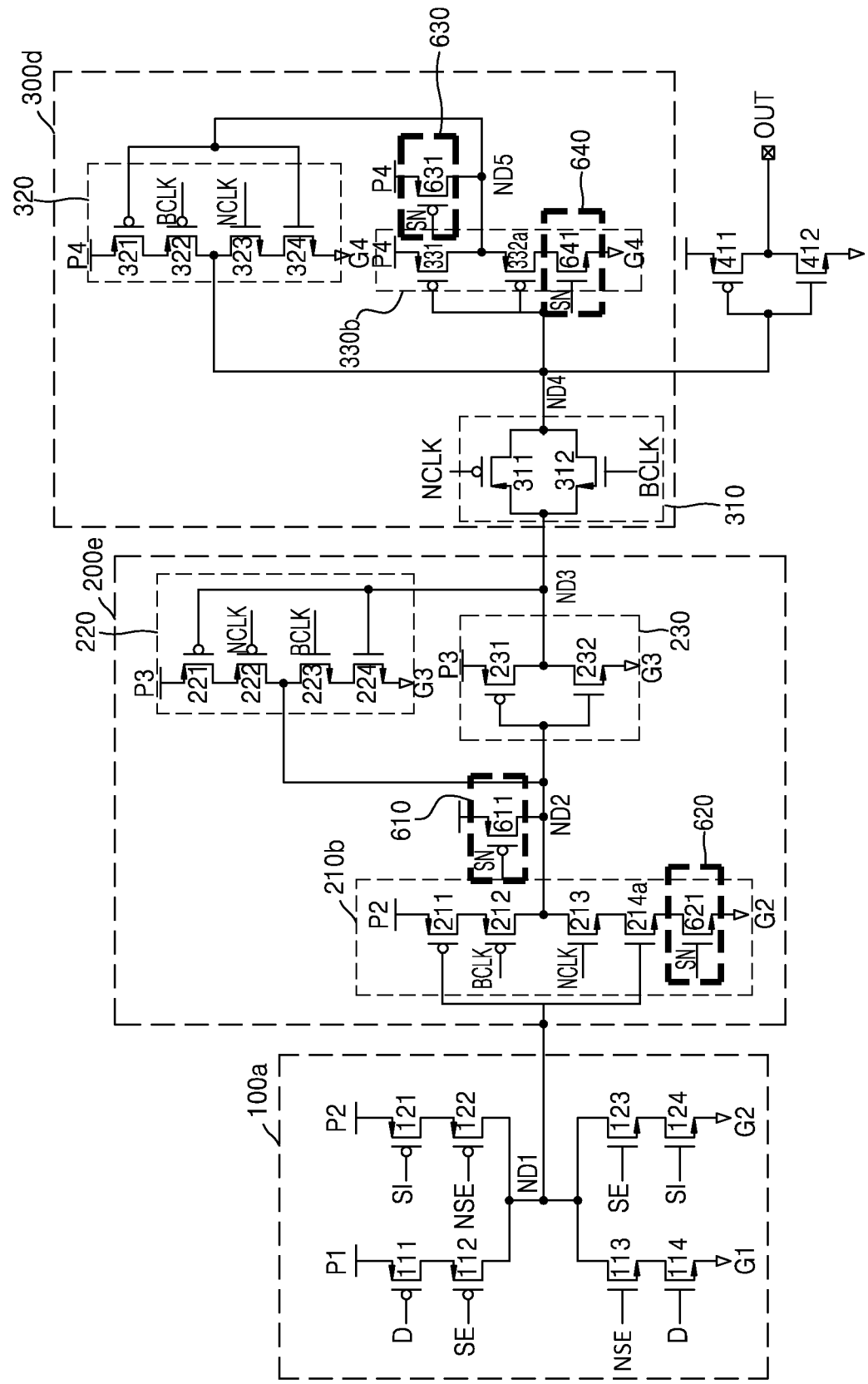
FIG. 9 is a circuit diagram illustrating a scan flip-flop according to another exemplary embodiment.

FIG. 9 is a circuit diagram illustrating a scan flip-flop 30A according to another exemplary embodiment.

Referring to FIG. 9, the scan flip-flop 30A according to another exemplary embodiment may be a scan flip-flop having a set function and may include a multiplexer 100a, a master latch 200e, and a slave latch 300d. The scan flip-flop 30A may correspond to a modification embodiment of the scan flip-flop 10A illustrated in FIG. 5. Hereinafter, a difference between the scan flip-flop 10A of FIG. 5 and the scan flip-flop 30A according to the present embodiment will be described. In this case, like reference numerals refer to like elements, and a repetitive description is not repeated.

The master latch 200e may include a third tri-state inverter 210b, a fourth tri-state inverter 220, a first inverter 230, and a first set switch 610. The first set switch 610 may include a PMOS transistor 611 that includes a source connected to a power terminal, a gate receiving an inversion set control signal SN, and a drain connected to a second output node ND2. In this case, the inversion set control signal SN may be a signal that is generated by inverting the set control signal S for controlling a set operation. When the set control signal S is activated, namely, when the inversion set control signal SN has a logic low level, the first set switch 610 may be turned on, and a voltage of the second output node ND2 may have a source voltage level, whereby an output of the master latch 200e may be set.

The third tri-state inverter 210b may include a third pull-up transistor 211, a third PMOS transistor 212, a third NMOS transistor 213, a third pull-down transistor 214a, and a second set switch 620. The second set switch 620 may include an NMOS transistor 621 that includes a gate receiving the inversion set control signal SN and a source connected to a second ground terminal G2. A source of the third pull-up transistor 214a may be connected to a drain of the NMOS transistor 621. When the set control signal S is activated, the second set switch 620 may be turned off, and thus, a ground voltage cannot be supplied to the second output node ND2.

The slave latch 300d may include a transmission gate 310, a fifth tri-state inverter 320, a second inverter 330b, and a third set switch 630. The third set switch 630 may include a PMOS transistor 631 that includes a source connected to a power terminal, a gate receiving the inversion set control signal SN, and a drain connected to the fifth output node ND5. When the set control signal S is activated, the third reset switch 630 may be turned on, and a voltage of a fifth output node ND5 may have a source voltage level.

The second inverter 330b may include a sixth pull-up transistor 331, a sixth pull-down transistor 332a, and a fourth set switch 640. The fourth set switch 640 may include an NMOS transistor 641 that includes a source connected to a fourth ground terminal G4 and a gate receiving the inversion set control signal SN. A source of the sixth pull-down transistor 332a may be connected to a drain of the NMOS transistor 641. When the set control signal S is activated, the fourth set switch 640 may be turned off, and thus, a ground voltage cannot be supplied to the fifth output node ND5.

According to the present embodiment, the multiplexer 100a, the master latch 200e, and the slave latch 300d included in the scan flip-flop 30A having the set function may each include a cross coupled unit like the scan flip-flip 10A illustrated in FIG. 5. For example, the multiplexer 100a, the master latch 200e, and the slave latch 300d may respec- tively include first to third cross coupled units XC1 to XC3. The first to third cross coupled units XC1 to XC3 may be implemented as in FIG. 4, thereby acquiring a 3 grid gain. Furthermore, the multiplexer 100a and the master latch 200e may share the second power terminal P2 and the second ground terminal G2, and thus, a 1 to 2 grid gain may be acquired for sizes of the multiplexer 100a and the master latch 200e.

According to the present embodiment, the scan flip-flop 30A may perform a set operation, based on the set control signal S indicating the set operation. For example, the scan flip-flip 30A may perform a normal operation or a scan test operation in response to the set control signal S having a logic low level and may perform the set operation in response to the set control signal S having a logic high level.

Figure 10:
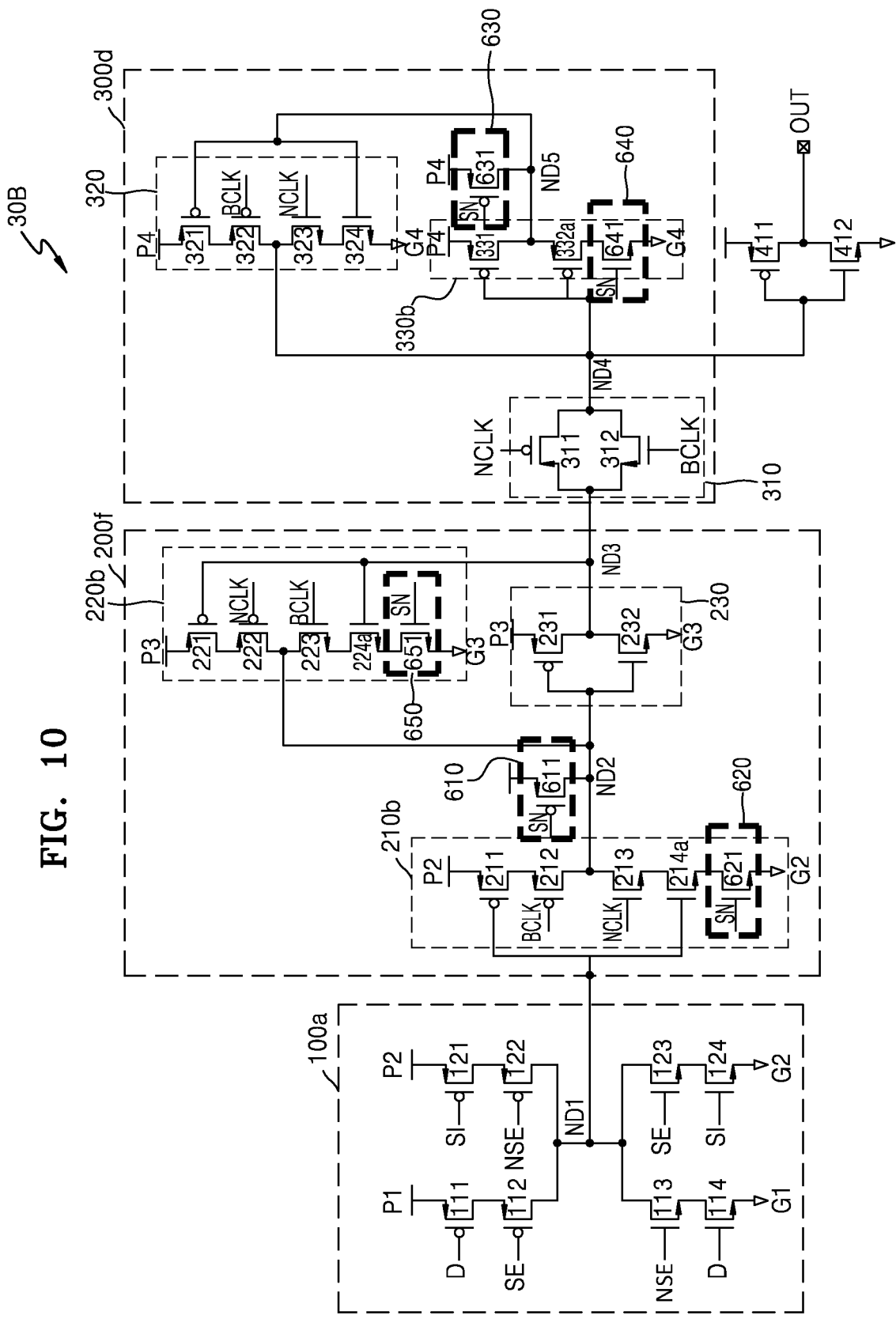
FIG. 10 is a circuit diagram illustrating a modification example of the scan flip-flop of FIG. 9.

FIG. 10 is a circuit diagram illustrating a modification example 30B of the scan flip-flop of FIG. 9.

Referring to FIG. 10, a scan flip-flop 30B according to the present embodiment may be a scan flip-flop having a set function and may include a multiplexer 100a, a master latch 200f, and a slave latch 300d. The scan flip-flop 30B may correspond to a modification embodiment of the scan flip-flop 30A illustrated in FIG. 9. Hereinafter, a difference between the scan flip-flop 30A of FIG. 9 and the scan flip-flop 30B according to the present embodiment will be described. In this case, like reference numerals refer to like elements, and a repetitive description is not repeated.

A fourth tri-state inverter 220b included in the master latch 200f may include a fourth pull-up transistor 221, a fourth PMOS transistor 222, a fourth NMOS transistor 223, a fourth pull-down transistor 224a, and a fifth set switch 650. The fifth set switch 650 may include an NMOS transistor 651 that includes a source connected to a third ground terminal G3 and a gate receiving an inversion set control signal SN. A source of the fourth pull-down transistor 224a may be connected to a drain of the NMOS transistor 651.

According to the present embodiment, when the set control signal S is activated, the fifth set switch 650 may be turned off, and thus, a ground voltage cannot be supplied to a second output node ND2. Therefore, even when a driving force of the fourth pull-down transistor 224a is strong, the second output node ND2 stably outputs a source voltage.

Figure 11:
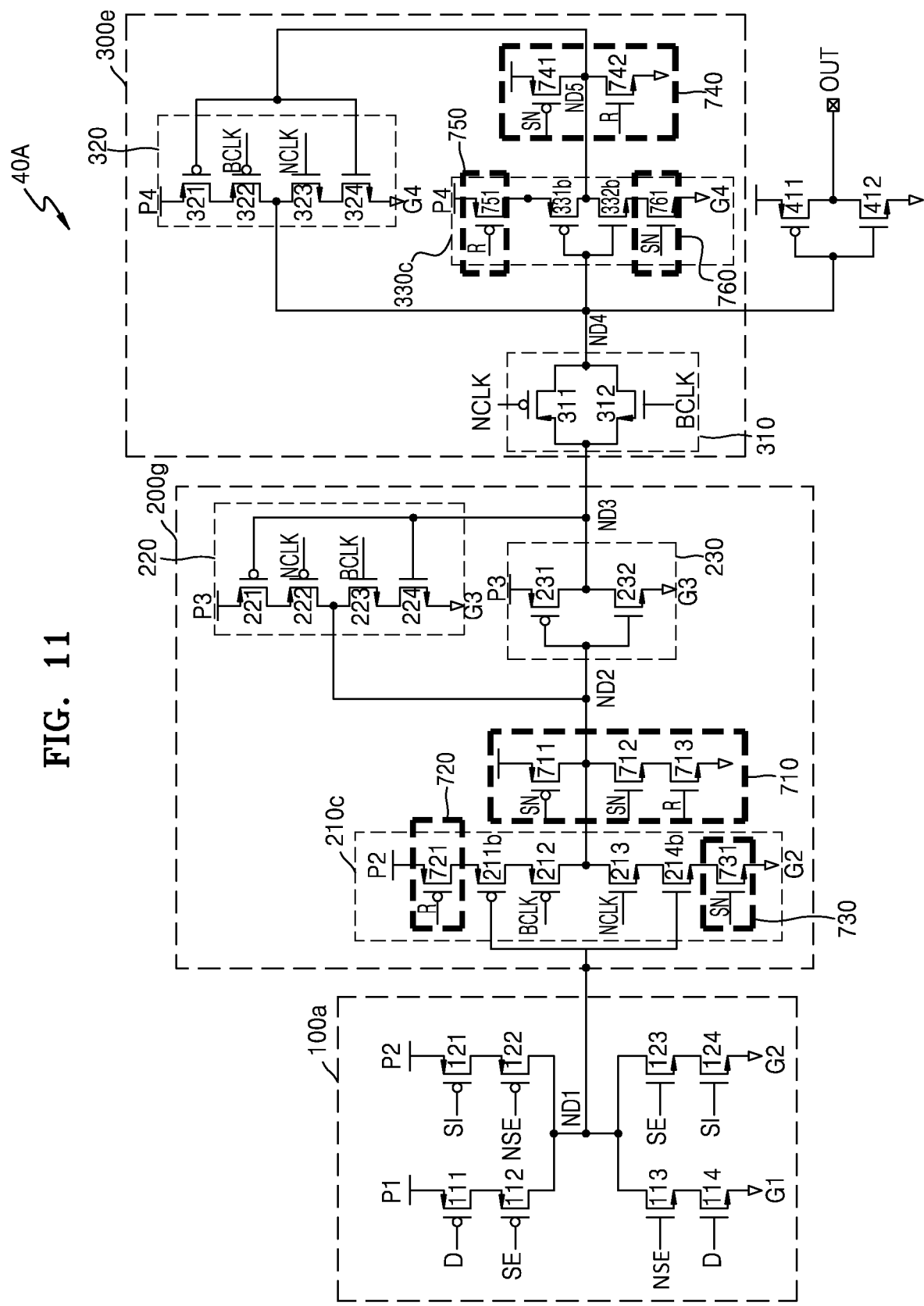
FIG. 11 is a circuit diagram illustrating a scan flip-flop according to another exemplary embodiment.

FIG. 11 is a circuit diagram illustrating a scan flip-flop 40A according to another exemplary embodiment.

Referring to FIG. 11, the scan flip-flop 40A according to another exemplary embodiment may be a scan flip-flop having a set/reset function and may include a multiplexer 100a, a master latch 200g, and a slave latch 300e. The scan flip-flop 40A may correspond to a modification embodiment of the scan flip-flop 10A illustrated in FIG. 5. Hereinafter, a difference between the scan flip-flop 10A of FIG. 5 and the scan flip-flop 40A according to the present embodiment will be described. In this case, like reference numerals refer to like elements, and a repetitive description is not repeated.

The master latch 200g may include a third tri-state inverter 210c, a fourth tri-state inverter 220, a first inverter 230, and a first set/reset switch 710. The first set/reset switch 710 may include a PMOS transistor 711 connected between a power terminal and a second output node ND2 and a plurality of NMOS transistors 712 and 713 which are serially connected between the second output node ND2 and a ground terminal. The PMOS transistor 711 and the NMOS transistor 712 may be turned on/off according to an inversion set control signal SN, and the NMOS transistor 713 may be turned on/off according to a reset control signal R.

When the reset control signal R is activated and a set control signal S is deactivated, the PMOS transistor 711 and the NMOS transistor 712 may be turned off, and the NMOS transistor 713 may be turned on, whereby a voltage of the second output node ND2 may have a ground voltage level and thus an output of the master latch 200g may be reset. When the reset control signal R is deactivated and the set control signal S is activated, the PMOS transistor 711 and the NMOS transistor 712 may be turned on, and the NMOS transistor 713 may be turned off, whereby the voltage of the second output node ND2 may have a source voltage level and thus an output of the master latch 200g may be set.

The third tri-state inverter 210c may include a first reset switch 720, a third pull-up transistor 211b, a third PMOS transistor 212, a third NMOS transistor 213, a third pull-down transistor 214b, and a first set switch 730. The first reset switch 720 may include a PMOS transistor 721 that includes a source connected to a second power terminal P2 and a gate receiving the reset control signal R. When the reset control signal R is activated, the first reset switch 720 may be turned off, and thus, a source voltage cannot be supplied to the second output node ND2. The first set switch 730 may be an NMOS transistor 731 that includes a source connected to a second ground terminal G2 and a gate receiving an inversion set control signal SN. When the set control signal S is activated, the first set switch 730 may be turned off, and thus, a ground voltage cannot be supplied to the second output node ND2.

The slave latch 300e may include a transmission gate 310, a fifth tri-state inverter 320, a second inverter 330c, and a second set/reset switch 740. The second set/reset switch 740 may include a PMOS transistor 741, which includes a source connected to a source terminal, a gate receiving the inversion set control signal SN, and a drain connected to a fifth output node ND5, and an NMOS transistor 742 that includes a drain connected to the fifth output node ND5 and a gate receiving the reset control signal R. When the reset control signal R is activated, the NMOS transistor 742 may be turned on, and a voltage of the fifth output node ND5 may have a ground level. On the other hand, when the set control signal S is activated, the PMOS transistor 741 may be turned on, and the voltage of the fifth output node ND5 may have a source voltage level.

The second inverter 330c may include a second reset switch 750, a sixth pull-up transistor 331b, a sixth pull-down transistor 332b, and a second set switch 760. The second reset switch 750 may include a PMOS transistor 751 that includes a source connected to a fourth power terminal P4 and a gate receiving the reset control signal R. A source of the sixth pull-up transistor 331b may be connected to a drain of the second reset switch 750. When the reset control signal R is activated, the second reset switch 750 may be turned off, and thus, a source voltage cannot be supplied to the fifth output node ND5.

The second set switch 760 may include an NMOS transistor 761 that includes a source connected to a fourth ground terminal G4 and a gate receiving the inversion set control signal SN. A source of the sixth pull-down transistor 332b may be connected to a drain of the NMOS transistor 761 and a source of the NMOS transistor 742. When the set control signal S is activated, the second set switch 760 may be turned off, and thus, a ground voltage cannot be supplied to the fifth output node ND5.

According to the present embodiment, the multiplexer 100a, the master latch 200g, and the slave latch 300e included in the scan flip-flop 40A having the set/reset function may each include a cross coupled unit like the scan flip-flip 10A illustrated in FIG. 5. For example, the multiplexer 100a, the master latch 200g, and the slave latch 300e may respectively include first to third cross coupled units XC1 to XC3. The first to third cross coupled units XC1 to XC3 may be implemented as in FIG. 4, thereby acquiring a 3 grid gain. Furthermore, the multiplexer 100a and the master latch 200g may share the second power terminal P2 and the second ground terminal G2, and thus, a 1 to 2 grid gain may be acquired for sizes of the multiplexer 100a and the master latch 200g.

According to the present embodiment, the scan flip-flop 40A may perform a reset operation, based on the reset control signal R indicating the reset operation and may perform a set operation, based on the set control signal S indicating the set operation. For example, the scan flip-flip 40A may perform a normal operation or a scan test operation in response to the reset control signal R having a logic low level and may perform the reset operation in response to the reset control signal R having a logic high level. Also, the scan flip-flip 40A may perform the normal operation or the scan test operation in response to the set control signal S having a logic low level and may perform the set operation in response to the set control signal S having a logic high level.

Figure 12:
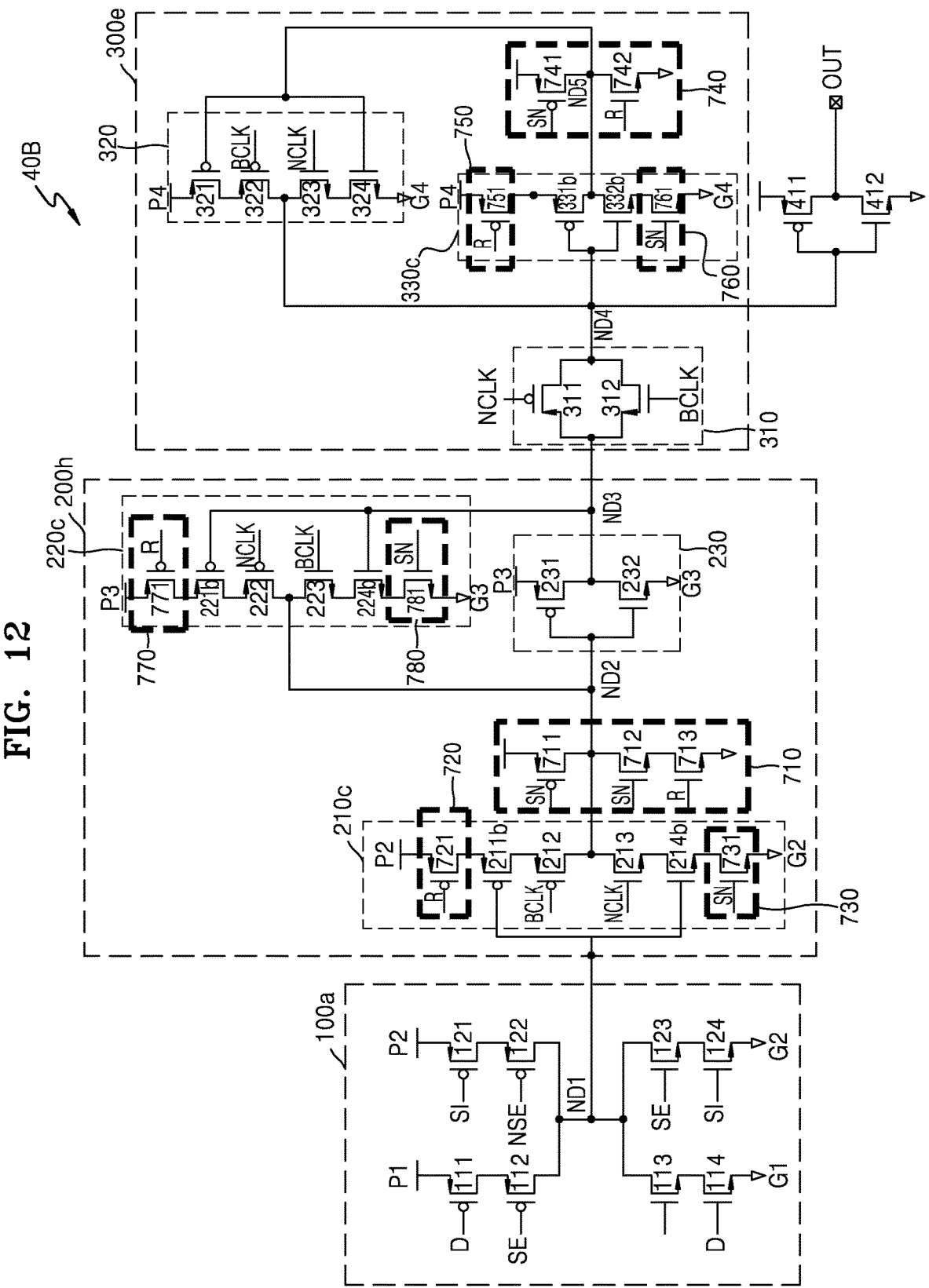
FIG. 12 is a circuit diagram illustrating a modification example of the scan flip-flop of FIG. 11.

FIG. 12 is a circuit diagram illustrating a modification example 40B of the scan flip-flop of FIG. 11.

Referring to FIG. 12, a scan flip-flop 40B according to the present embodiment may be a scan flip-flop having a set/reset function and may include a multiplexer 100a, a master latch 200h, and a slave latch 300e. The scan flip-flop 40B may correspond to a modification embodiment of the scan flip-flop 40A illustrated in FIG. 11. Hereinafter, a difference between the scan flip-flop 40A of FIG. 11 and the scan flip-flop 40B according to the present embodiment will be described. In this case, like reference numerals refer to like elements, and a repetitive description is not repeated.

A fourth tri-state inverter 220c included in the master latch 200h may include a third reset switch 770 connected to a third power terminal P3, a fourth pull-up transistor 221b, a fourth PMOS transistor 222, a fourth NMOS transistor 223, a fourth pull-down transistor 224b, and a third set switch 780. The third reset switch 770 may include a PMOS transistor 771 that includes a source connected to a third power terminal P3 and a gate receiving a reset control signal R. A source of the fourth pull-up transistor 221b may be connected to a drain of the PMOS transistor 771. The third set switch 780 may include an NMOS transistor 772 that includes a source connected to the third ground terminal G3 and a gate receiving the inversion set control signal SN. A source of the fourth pull-down transistor 224b may be connected to a drain of the NMOS transistor 772.

According to the present embodiment, when the reset control signal R is activated, the third reset switch 770 may be turned off, and thus, a source voltage cannot be supplied to a second output node ND2. Therefore, even when a driving force of the fourth pull-up transistor 221b is strong, the second output node ND2 stably outputs a ground voltage. Also, when the set control signal S is activated, the third set switch 780 may be turned off, and thus, a ground voltage cannot be supplied to the second output node ND2. Therefore, even when a driving force of the fourth pull-down transistor 224b is strong, the second output node ND2 stably outputs the source voltage.

Figure 13:
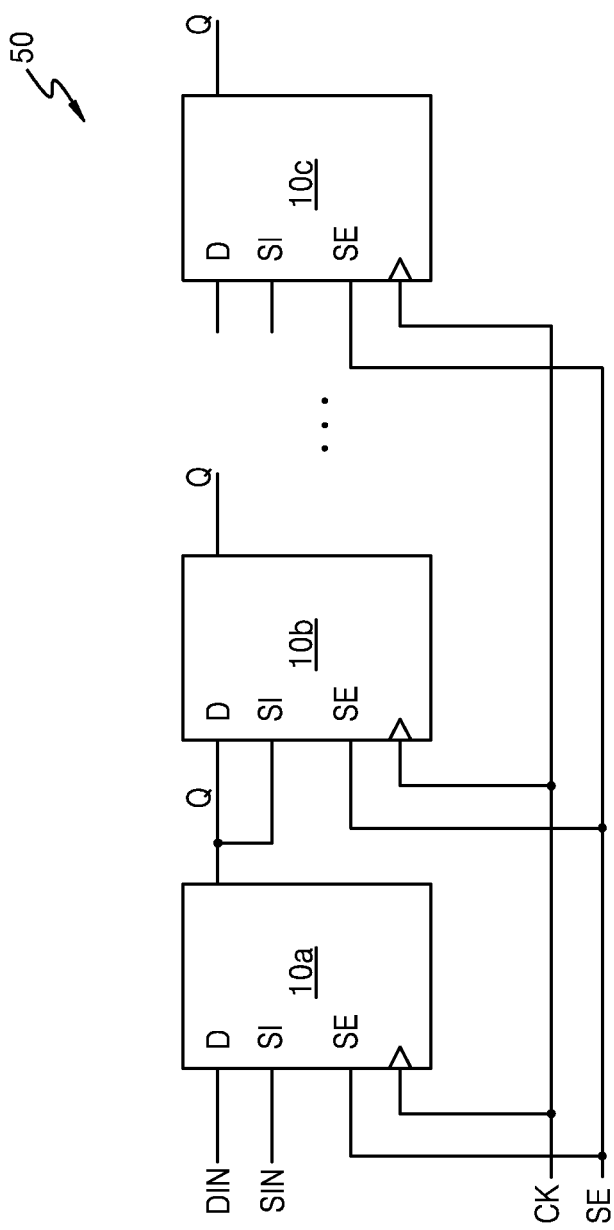
FIG. 13 is a block diagram illustrating a scan chain including a scan flip-flop according to an exemplary embodiment.

FIG. 13 is a block diagram illustrating a scan chain 50 including a scan flip-flop according to an exemplary embodiment.

Referring to FIG. 13, the scan chain 50 may include a plurality of scan flip-flops 10a to 10c, and each of the plurality of scan flip-flops 10a to 10c may be implemented as one of the scan flip-flops illustrated in FIGS. 1 to 12. Each of the plurality of scan flip-flops 10a to 10c may be manufactured by using a standard cell included in a standard cell library. For example, the standard cell may be manufactured as in FIG. 6.

Each of the plurality of scan flip-flops 10a to 10c may include a first terminal D receiving a data input signal and a second terminal SI receiving a scan input signal, and may supply output data Q. In detail, a first scan flip-flop 10a may include a first terminal D receiving input data DIN and a second terminal SI receiving scan data SIN. The second scan flip-flop 10b may include first and second terminals D and SI receiving the output data D from the first scan flip-flop 10a.

However, the present embodiment is not limited thereto. In some embodiments, the first and second terminals D and SI of the first scan flip-flop 10a may respectively receive the output data Q and inversion output data. Also, in some embodiments, the first and second terminals D and SI of the first scan flip-flop 10a may receive the inversion output data. Although not shown, in some embodiments, the output data Q from the first scan flip-flop 10a may be processed by a logic circuit and may be input to at least one of the first and second terminals D and SI of the second scan flip-flop 10b. Here, a logic network may be a combinational logic circuit.

Figure 14:
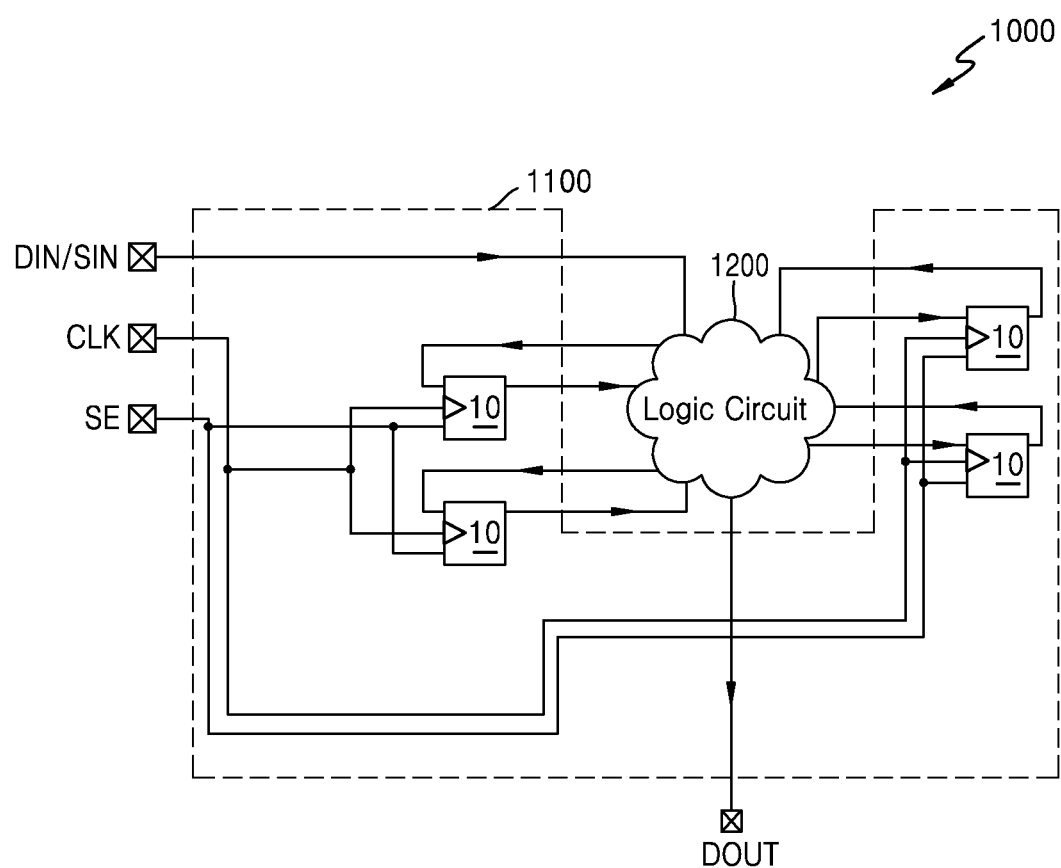
FIG. 14 is a block diagram illustrating a data processing apparatus including a scan flip-flop according to an exemplary embodiment.

FIG. 14 is a block diagram illustrating a data processing apparatus 1000 including a scan flip-flop according to an exemplary embodiment.

Referring to FIG. 14, the data processing apparatus 1000 may include a scan flip-flop group 1100 and a logic circuit 1200. The data processing apparatus 1000 may be implemented with an integrated circuit (IC), a system on chip (SoC), a central processing unit (CPU), a processor, or the like.

The scan flip-flop group 1100 may include a plurality of scan flip-flops 10. Each of the scan flip-flops 10 may be implemented as one of the scan flip-flops illustrated in FIGS. 1 to 13. Each of the scan flip-flops 10 may perform data communication with a logic circuit 1200 according to a clock signal CLK. The logic circuit 1200 may be implemented as a synchronous circuit or an asynchronous circuit. The logic circuit 1200 may process input data DIN or scan data SIN and may supply output data DOUT corresponding to a result of the processing.

Figure 15:
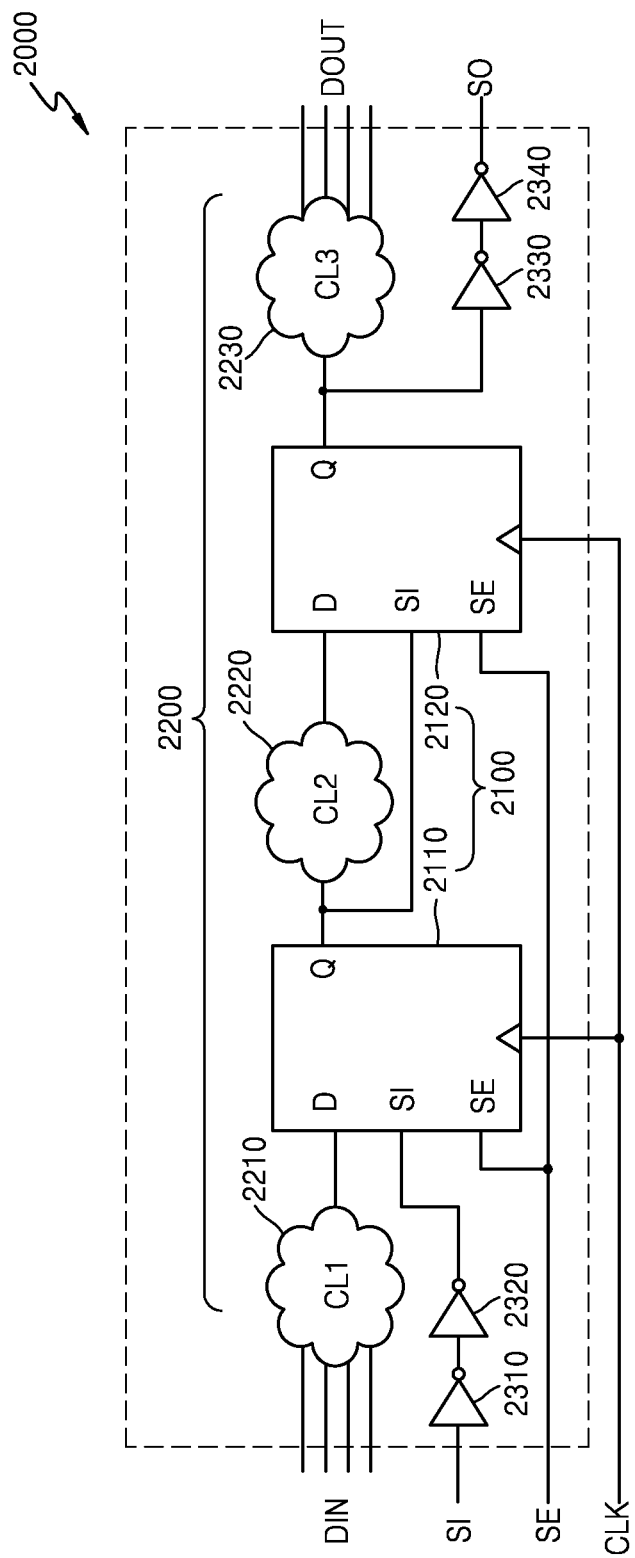
FIG. 15 is a block diagram illustrating a scan test circuit including a scan flip-flop according to an exemplary embodiment.

FIG. 15 is a block diagram illustrating a scan test circuit 2000 including a scan flip-flop according to an exemplary embodiment.

Referring to FIG. 15, the scan test circuit 2000 may include a sequential circuit unit 2100, a combinational circuit unit 2200, and a plurality of inverters 2310 to 2340. The sequential circuit unit 2100 may include first and second scan flip-flops 2110 and 2120, and the combinational circuit unit 2200 may include first to third combinational logic circuits 2210, 2220 and 2230.

The first combinational logic circuit 2210 may perform an arithmetic operation on pieces of input data DIN to supply a data input signal D to a first scan flip-flop 2210. The first scan flip-flop 2210 may be synchronized with a clock signal CLK, may supply the data input signal D as output data Q in a normal operation mode (for example, a mode where a scan enable signal SE has a logic low level), and may supply a scan input signal SI as the output data Q in a scan test mode (for example, a mode where the scan enable signal SE has a logic high level).

The second combinational logic circuit 2220 may perform an arithmetic operation on the output data Q of the first scan flip-flop 2110 to supply the data input signal D to the second scan flip-flop 2120. Also, the second scan flip-flop 2120 may receive the output data Q of the first scan flip-flop 2110 as a scan input signal SI. Also, the second scan flip-flop 2120 may operate according to the normal operation mode or the scan test mode, based on the scan enable signal SE and the clock signal CLK.

The third combinational logic circuit 2230 may perform an arithmetic operation on the output data Q of the second scan flip-flop 2120 to supply pieces of output data DOUT. Also, in the scan test mode, the third combinational logic circuit 2230 may supply, via the inverters 2330 and 2340, the output data Q of the second scan flip-flop 2120 as a scan output SO.

Figure 16:
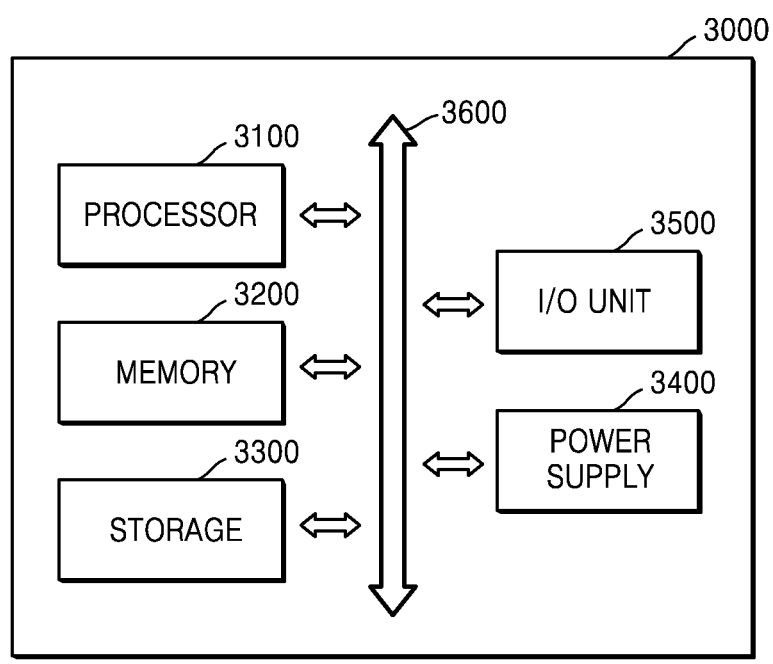
FIG. 16 is a block diagram illustrating a computing system including a scan flip-flop according to an exemplary embodiment.

FIG. 16 is a block diagram illustrating a computing system 3000 including a scan flip-flop according to an exemplary embodiment.

Referring to FIG. 16, the computing system 3000 may include a processor 3100, a memory 3200, a storage 3300, a power supply 3400, and an input/output unit 3500. Although not shown in FIG. 16, the computing system 3000 may further include a plurality of ports that communicate with a video card, a sound card, a memory card, a universal serials bus (USB), and/or the like, or communicate with other electronic devices.

As described above, the processor 3100, the memory 3200, the storage 3300, the power supply 3400, or the input/output unit 3500 included in the computing system 3000 may include a scan flip-flop according to some exemplary embodiments. In an exemplary embodiment, at least one of a plurality of semiconductor devices which are included in the processor 3100, the memory 3200, the storage 3300, the power supply 3400, or the input/output unit 3500 may include an input unit, which selects one signal from among a data input signal and a scan input signal and supplies the selected signal as an internal signal according to an operation mode, and a scan flip-flop that has a cross coupled structure, including first and second tri-state inverters which share a first output node and face each other, and includes a flip-flop that latches the internal signal according to the clock signal CLK.

The processor 3100 may perform certain arithmetic operations or tasks. According to some exemplary embodiments, the processor 3100 may be a microprocessor, a central processing unit (CPU), or the like. The processor 3100 may communicate with the memory 3200, the storage 3300, and the input/output unit 3500 through a bus 3600 such as an address bus, a control bus, a data bus, and/or the like. According to some exemplary embodiments, the processor 3100 may be connected to an extension bus such as a peripheral component interconnect (PCI) bus or the like.

The memory 3200 may store data necessary for an operation of the computing system 3000. For example, the memory 3200 may be implemented with a dynamic random access memory (DRAM), a mobile DRAM, a static random access memory (SRAM), a phase-change random access memory (PRAM), a ferroelectric random access memory (FRAM), a resistive random access memory (RRAM), a magnetic random access memory (MRAM), and/or the like. The storage 3300 may include a solid state drive, a hard disk drive, a CD-ROM, and/or the like. The input/output unit 3500 may include an input means, such as a keyboard, keypad, a mouse, and/or the like, and an output means such as a printer, a display, and/or the like. The power supply 3400 may supply an operating voltage necessary for an operation of the computing system 3000.

The scan flip-flop according to the exemplary embodiments of the present inventive concepts and an IC including the scan flip-flop may each be implemented using any of a variety of packaging technologies. For example, some elements of the IC may be mounted by using technologies such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi-chip package (MCP), wafer-level fabricated package (WFP), wafer-level processed stack package (WSP), and/or the like.

While the inventive concepts have been particularly shown and described with reference to exemplary embodiments thereof, it will be understood that various changes in form and details may be made therein without departing from the spirit and scope of the following claims.

What is claimed is:

1. A scan flip-flop comprising:
an input unit; and
a flip-flop comprising a master latch and a slave latch, the flip-flop connected to the input unit,
wherein the flip-flop is implemented to include a plurality of cross coupled structures, and
wherein at least one of the plurality of cross coupled structures is implemented in an area corresponding to a 2 CPP (contact poly pitch).

2. The scan flip-flop of claim 1, wherein the at least one of the plurality of cross coupled structures comprises:
a plurality of first active fins which extend along a first direction and are disposed in parallel in a second direction substantially vertical to the first direction;
a plurality of second active fins which extend along the first direction and are disposed in parallel in the second direction;
first and second conductive lines extending in parallel across the plurality of first active fins;
third and fourth conductive lines extending in parallel across the plurality of second active fins;
a cutout region disposed between the first conductive line and the third conductive line, and between the second conductive line and the fourth conductive line; and
a diagonal contact which traverses the cutout region and connects the second conductive line and third conductive line,
wherein the first conductive line is aligned with the third conductive line, and
the second conductive line is aligned with the fourth conductive line.

3. The scan flip-flop of claim 2, wherein the at least one of the plurality of cross coupled structures further comprises at least one dummy fin which extends along the first direction and is disposed between the plurality of first active fins and the plurality of second active fins.

4. The scan flip-flop of claim 1, wherein the master latch includes a first tri-state inverter and a second tri-state inverter which share a first output node and face each other.

5. The scan flip-flop of claim 4, wherein the first tri-state inverter comprises a first pull-up unit, a first pull-down unit, a first PMOS transistor connected between the first pull-up unit and the first output node, and a first NMOS transistor connected between the first output node and the first pull-down unit, and
the second tri-state inverter comprises a second pull-up unit, a second pull-down unit, a second PMOS transistor connected between the second pull-up unit and the first output node, and a second NMOS transistor connected between the first output node and the second pull-down unit.

6. The scan flip-flop of claim 5, wherein a gate of the first PMOS transistor is electrically connected to a gate of the second NMOS transistor, a gate of the first NMOS transistor is electrically connected to a gate of the second PMOS transistor, and the first and second PMOS transistors and the first and second NMOS transistors constitute a first cross coupled unit.

7. A scan flip-flop comprising:
an input unit; and
a flip-flop comprising a master latch and a slave latch, the flip-flop connected to the input unit,
wherein the flip-flop is implemented to include a plurality of cross coupled structures, and
wherein at least one of the plurality of cross coupled structures is implemented in an area corresponding to a 3 CPP (contact poly pitch).

8. A scan flip-flop comprising:
an input unit; and
a flip-flop comprising a master latch and a slave latch, the flip-flop connected to the input unit,
wherein the flip-flop is implemented to include a plurality of cross coupled structures, and
wherein the input unit comprises a multiplexer implemented to include a cross coupled structure.

9. A flip-flop comprising:
a plurality of first active fins which extend along a first direction and are disposed in parallel in a second direction substantially vertical to the first direction;
a plurality of second active fins which extend along the first direction and are disposed in parallel in the second direction;
a first conductive line and a second conductive line that extend in parallel across the plurality of first active fins;
a third conductive line and a fourth conductive line that extend in parallel across the plurality of second active fins;
a cutout region disposed between the first conductive line and the third conductive line, and between the second conductive line and the fourth conductive line; and
a diagonal contact which traverses the cutout region and connects the second conductive line and third conductive line,
wherein the first conductive line is aligned with the third conductive line, and
the second conductive line is aligned with the fourth conductive line.

10. The flip-flop of claim 9, further comprising:
at least one dummy fin which extends along the first direction and is disposed between the plurality of first active fins and the plurality of second active fins.

11. The flip-flop of claim 9, further comprising:
a first contact disposed between the first conductive line and the second conductive line;
a first via on the first contact;
a second contact disposed between the third conductive line and the fourth conductive line; and
a second via on the second contact.

12. The flip-flop of claim 9, further comprising:
a first gate contact on the first conductive line;
a second gate contact on the second conductive line;
a third gate contact on the third conductive line; and
a fourth gate contact on the fourth conductive line, wherein the first and second gate contacts are disposed to be spaced apart from a lower boundary line of the flip-flop by a first distance, and the third and fourth gate contacts are disposed to be spaced apart from the lower boundary line of the flip-flop by a second distance.

13. The flip-flop of claim 12, wherein a height from a substrate to an upper surface of the diagonal contact is substantially the same as a height from the substrate to an upper surface of the first gate contact or a height from the substrate to an upper surface of the fourth gate contact.

14. The flip-flop of claim 9, further comprising:
a power line that extends along the first direction and is disposed adjacent to the plurality of first active fins in the second direction; and
a ground line that extends along the first direction and is disposed adjacent to the plurality of second active fins in the second direction.

15. The flip-flop of claim 9, wherein the plurality of first active fins, the plurality of second active fins, the first to fourth conductive lines, the cutout region, and the diagonal contact correspond to a cross coupled structure.

16. A semiconductor device including a cross coupled structure, the cross coupled structure comprising:
a plurality of first active fins which extend along a first direction and are disposed in parallel in a second direction substantially vertical to the first direction;
a plurality of second active fins which extend along the first direction and are disposed in parallel in the second direction;
a first conductive line and a second conductive line that extend in parallel across the plurality of first active fins; and
a third conductive line and a fourth conductive line that extend in parallel across the plurality of second active fins,
wherein the cross coupled structure is implemented in an area corresponding to a 2 CPP (contact poly pitch).

17. The semiconductor device of claim 16, further comprising:
at least one dummy fin which extends along the first direction and is disposed between the plurality of first active fins and the plurality of second active fins.

18. The semiconductor device of claim 16, wherein the cross coupled structure further comprises:
a cutout region disposed between the first conductive line and the third conductive line, and between the second conductive line and the fourth conductive line; and
a diagonal contact which traverses the cutout region and connects the second conductive line and third conductive line,
wherein the first conductive line is aligned with the third conductive line, and
the second conductive line is aligned with the fourth conductive line.

* * * * *